(12) United States Patent
Kobayashi et al.

(10) Patent No.: US 11,011,609 B2
(45) Date of Patent: *May 18, 2021

(54) METHOD OF MANUFACTURING A SEMICONDUCTOR DEVICE

(71) Applicant: KABUSHIKI KAISHA TOSHIBA, Tokyo (JP)

(72) Inventors: Kenya Kobayashi, Ishikawa (JP); Tetsuo Matsuda, Ishikawa (JP); Yosuke Himori, Kanagawa (JP); Toshifumi Nishiguchi, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 42 days.

This patent is subject to a terminal disclaimer.

(21) Appl. No.: 15/943,147

(22) Filed: Apr. 2, 2018

(65) Prior Publication Data

US 2018/0226473 A1    Aug. 9, 2018

Related U.S. Application Data

(62) Division of application No. 15/448,126, filed on Mar. 2, 2017, now Pat. No. 9,947,751.

(30) Foreign Application Priority Data

Sep. 16, 2016 (JP) ................................. 2016-182023

(51) Int. Cl.
*H01L 29/423* (2006.01)
*H01L 29/66* (2006.01)
(Continued)

(52) U.S. Cl.
CPC .. *H01L 29/42376* (2013.01); *H01L 21/26506* (2013.01); *H01L 21/31111* (2013.01);
(Continued)

(58) Field of Classification Search
CPC . H01L 29/407; H01L 29/401; H01L 29/0642; H01L 29/4236; H01L 29/66477;
(Continued)

(56) References Cited

U.S. PATENT DOCUMENTS 5,059,550 A * 10/1991 Tateoka ................ H01L 21/763
257/506
5,075,823 A    12/1991 Chomyn
(Continued)

OTHER PUBLICATIONS

Baba et al., "A study on a high blocking voltage UMOS-FET with a double gate structure," in Proc. of ISPSD, 1992, pp. 300-302.
(Continued)

*Primary Examiner* — Mohsen Ahmadi
(74) *Attorney, Agent, or Firm* — Foley & Lardner LLP

(57) ABSTRACT

A semiconductor device includes a first semiconductor region of a first conductivity type, a second semiconductor region of a second conductivity type provided on the first semiconductor region, a third semiconductor region of the first conductivity type provided on the second semiconductor region, a first insulating part provided in the first semiconductor region, a first electrode provided in the first semiconductor region, the first insulating part disposed between the first electrode and the first semiconductor region, a second insulating part provided on the first electrode, a gate electrode provided on the second insulating part, a gate insulating part provided between the gate electrode and the second semiconductor region, and a second electrode provided on the second semiconductor region and on the third semiconductor region, and is electrically connected to the second semiconductor region, the third semiconductor region, and the first electrode.

16 Claims, 20 Drawing Sheets

(51) Int. Cl.
| | |
|---|---|
| *H01L 29/40* | (2006.01) |
| *H01L 29/78* | (2006.01) |
| *H01L 29/06* | (2006.01) |
| *H01L 21/265* | (2006.01) |
| *H01L 21/311* | (2006.01) |
| *H01L 21/8234* | (2006.01) |
| *H01L 27/088* | (2006.01) |
| *H01L 29/51* | (2006.01) |
| *H01L 29/417* | (2006.01) |

(52) U.S. Cl.
CPC .... *H01L 21/823481* (2013.01); *H01L 27/088* (2013.01); *H01L 29/0653* (2013.01); *H01L 29/401* (2013.01); *H01L 29/407* (2013.01); *H01L 29/42368* (2013.01); *H01L 29/66734* (2013.01); *H01L 29/7813* (2013.01); *H01L 29/41766* (2013.01); *H01L 29/511* (2013.01); *H01L 29/66666* (2013.01); *H01L 29/7827* (2013.01)

(58) Field of Classification Search
CPC ......... H01L 21/823481; H01L 29/7813; H01L 29/7825; H01L 29/66613–66628; H01L 29/42336; H01L 29/42352; H01L 27/088; H01L 27/2463; H01L 27/249; H01L 29/66666
See application file for complete search history.

(56) References Cited

U.S. PATENT DOCUMENTS

| | | | | |
|---|---|---|---|---|
| 5,561,078 | A * | 10/1996 | Tasaka | H01L 21/76224 438/437 |
| 5,637,898 | A | 6/1997 | Baliga | |
| 5,998,833 | A | 12/1999 | Baliga | |
| 6,727,144 | B2 * | 4/2004 | Hashimoto | H01L 27/115 257/E21.682 |
| 7,385,248 | B2 * | 6/2008 | Herrick | H01L 29/407 257/330 |
| 8,803,207 | B2 * | 8/2014 | Grebs | H01L 29/407 257/288 |
| 8,969,157 | B2 * | 3/2015 | Takahashi | H01L 29/401 438/270 |
| 8,981,470 | B2 * | 3/2015 | Nozu | H01L 29/7813 257/331 |
| 9,786,770 | B1 * | 10/2017 | John | H01L 21/26513 |
| 2006/0163678 | A1 * | 7/2006 | Anezaki | H01L 29/40117 257/411 |
| 2006/0286713 | A1 * | 12/2006 | Lee | H01L 21/76224 438/106 |
| 2008/0242026 | A1 * | 10/2008 | Matsuzaki | H01L 27/115 438/264 |
| 2009/0026531 | A1 * | 1/2009 | Poelzl | H01L 29/7811 257/330 |
| 2012/0326227 | A1 * | 12/2012 | Burke | H01L 29/7811 257/330 |
| 2013/0069150 | A1 * | 3/2013 | Matsuoka | H01L 29/42376 257/330 |
| 2013/0082768 | A1 | 4/2013 | Hirler et al. | |
| 2013/0221431 | A1 * | 8/2013 | Musha | H01L 29/7827 257/330 |
| 2013/0302958 | A1 | 11/2013 | Hossain et al. | |
| 2013/0323921 | A1 * | 12/2013 | Burke | H01L 21/02164 438/589 |
| 2014/0077278 | A1 | 3/2014 | Nozu | |
| 2014/0287574 | A1 * | 9/2014 | Takahashi | H01L 29/407 438/586 |
| 2015/0357232 | A1 * | 12/2015 | Ujihara | H01L 21/02326 438/427 |
| 2016/0064546 | A1 | 3/2016 | Zitouni et al. | |
| 2016/0079374 | A1 | 3/2016 | Okumura | |
| 2016/0093719 | A1 * | 3/2016 | Kobayashi | H01L 29/66734 257/330 |
| 2016/0141409 | A1 * | 5/2016 | Takaya | H01L 29/42368 257/330 |
| 2016/0225862 | A1 | 8/2016 | Hara et al. | |
| 2016/0240621 | A1 * | 8/2016 | Yip | H01L 29/66734 |
| 2016/0268419 | A1 | 9/2016 | Kawaguchi | |
| 2016/0365433 | A1 | 12/2016 | Matsuura | |
| 2017/0033206 | A1 | 2/2017 | Matsuura | |
| 2017/0040425 | A1 | 2/2017 | Kueck et al. | |
| 2017/0047444 | A1 | 2/2017 | Tanaka et al. | |

OTHER PUBLICATIONS

Chen et al., "Design of Gradient Oxide-Bypassed Superjunction Power MOSFET Devices," IEEE Trans on Power Electronics, vol. 22, No. 4, 2007, pp. 1303-1310.
Deng et al., "Doping Engineering for Improved Immunity against BV Softness and BV Shift in Trench Power MOSFET," in Proc. of ISPSD, 2016, pp. 375-378.
Gajda et al., "Industrialisation of resurf stepped oxide technology for power transistors," in Proc. of ISPSD, 2006, pp. 109-112.
Goarin et al., "Split-gate resurf stepped oxide (RSO) MOSFETs for 25 V applications with record low gate-to-drain charge," in Proc. of ISPSD, 2007, pp. 61-64.
Hossain et al., "3-D TCAD Simulation to Optimize the Trench Termination Design for Higher and Robust BVDss," in Proc. of ISPSD, 2016, pp. 391-394.
Hossain et al., "Process & Design Impact on BVDss Stability of a Shielded Gate Trench Power MOSFET," in Proc. of ISPSD, 2014, pp. 378-381.
Kobayashi et al., "100 V Class Multiple Stepped Oxide Field Plate Trench MOSFET(MSO-FP-MOSFET) Aimed to Ultimate Structure Realization," in Proc. of ISPSD, 2015, pp. 141-144.
Kobayashi et al., "An 18V n-channel UMOSFET with super low on-resistance by using vertical resurf structure," in the Papers of Joint Technical Meeting, IEE Japan, EDD-12-068, SPC-12-141, pp. 49-53, 2012. (In Japanese with an English abstract).
Kodama et al., "Temperature characteristics of a new 100V rated power MOSFET, VLMOS (Vertical LOCOS MOS)," in Proc. of ISPSD, 2004, pp. 463-466.
Koops et al., "Resurf stepped oxide (RSO) MOSFET for 85V having a record-low specific on-resistance," in Proc. of ISPSD, 2004, pp. 185-188.
Yedinak et al., "Avalanche Instability in Oxide Charge Balanced Power MOSFETS," in Proc. of ISPSD, 2011, pp. 156-159.
Yedinak et al., "Optimizing Oxide Charge Balanced Devices for Unclamped Inductive Switching (UIS)," in Proc. of ISPSD, 2010, pp. 333-336.

* cited by examiner

METHOD OF MANUFACTURING A SEMICONDUCTOR DEVICE

CROSS-REFERENCE TO RELATED APPLICATION

This application claims the benefit of and priority to U.S. patent application Ser. No. 15/448,126, filed Mar. 2, 2017, which claims priority to Japanese Patent Application No. 2016-182023, filed Sep. 16, 2016; the entire contents of which are incorporated herein by reference.

FIELD

Embodiments described herein relate generally to a semiconductor device and a method of manufacturing the same.

BACKGROUND

A semiconductor device is provided, such as a MOSFET (Metal Oxide Semiconductor Field Effect Transistor), which performs a switching between an ON state and an OFF state to control a voltage to be applied to a gate electrode. In such a semiconductor device, it can be desirable to prevent a self-turning ON phenomenon in which the semiconductor device unintentionally enters the ON state.

SUMMARY

In some embodiments, according to one aspect, a semiconductor device includes a first semiconductor region of a first conductivity type, a second semiconductor region of a second conductivity type that is provided on the first semiconductor region, a third semiconductor region of the first conductivity type that is provided on the second semiconductor region, a first insulating part that is provided in the first semiconductor region, a first electrode that is provided in the first semiconductor region, the first insulating part disposed between the first electrode and the first semiconductor region, a second insulating part that is provided on the first electrode, a gate electrode that is provided on the second insulating part, a gate insulating part that is provided between the gate electrode and the second semiconductor region, and a second electrode that is provided on the second semiconductor region and on the third semiconductor region, and is electrically connected to the second semiconductor region, the third semiconductor region, and the first electrode. The gate electrode has a lower surface indented upward, defining a first recess and a second recess, and a first side surface that faces the second semiconductor region in a first direction via the gate insulating part. The first recess is positioned between the second recess and the first side surface in the first direction, and a distance in the first direction between the first recess and the second recess is longer than a distance in the first direction between the first side surface and the first recess.

In some embodiments, according to another aspect, a semiconductor device includes a first semiconductor region of a first conductivity type, a second semiconductor region of a second conductivity type that is provided on the first semiconductor region, a third semiconductor region of the first conductivity type that is provided on the second semiconductor region, a first insulating part that is provided in the first semiconducting region, a first electrode that is provided in the first semiconductor region having a side surface, the first insulating part disposed between the first electrode and the first semiconducting region, a second insulating part that is provided on the first electrode, a gate electrode that has a lower surface which defines a recess indented upward, provided on the second insulating part, a gate insulating part that is provided between the gate electrode and the second semiconductor region, and a second electrode that is provided on the second semiconductor region and on the third semiconductor region, and electrically connected to the second semiconductor region, the third semiconductor region, and the first electrode. The gate electrode faces the second semiconductor region in a first direction via the gate insulating part, and the recess is in line with a corner between an upper surface of the first electrode and the side surface of the first electrode in a vertical direction.

In some embodiments, according to another aspect, a method of manufacturing a semiconductor device includes providing a semiconductor substrate including a first semiconductor layer in which a first trench is formed in an upper surface, a first insulating layer that is provided along an inner wall of the first trench, a first electrode that is provided in a lower portion in the first trench on the first insulating layer, and a second insulating layer that is provided on an upper surface of the first electrode. The method further includes forming a third insulating layer along a surface of the first insulating layer and along a surface of the second insulating layer, the third insulating layer having an etching rate lower than an etching rate of the first insulating layer for an etching process, forming a fourth insulating layer on the second insulating layer, covering the first trench, and having an etching rate higher than an etching rate of the third insulating layer for the etching process, removing at least a part of the first insulating layer, a part of the third insulating layer, and a part of the fourth insulating layer, forming a first projection and a second projection in an upper surface of another part of the third insulating layer, positioned on the second insulating layer and protruding upward, and forming a gate electrode on the second insulating layer and the other part of the third insulating layer.

DETAILED DESCRIPTION

Figure 1:
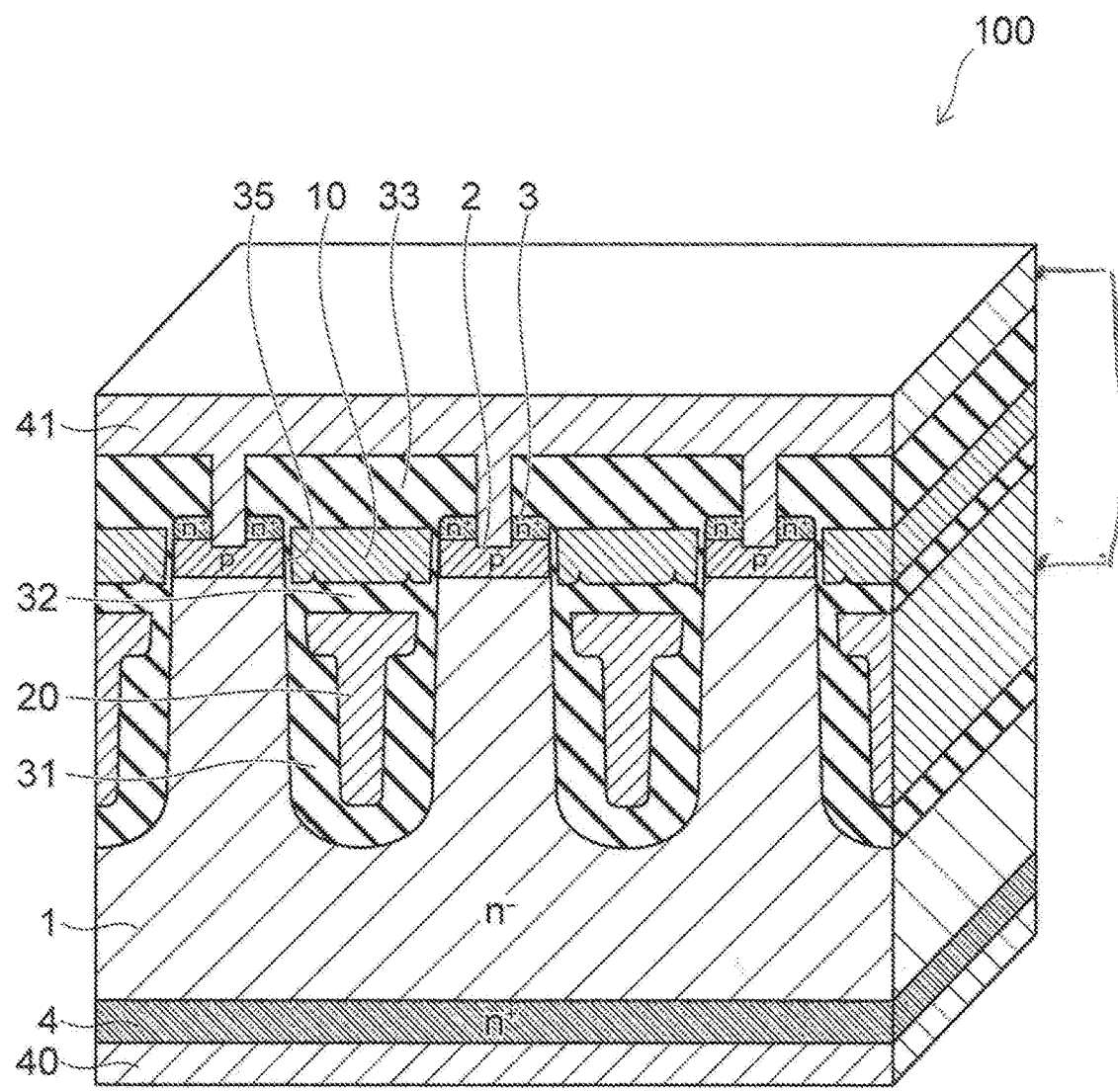
FIG. 1 is a cross-sectional perspective view illustrating embodiments of a part of a semiconductor device according to a first aspect.
Figure 1:
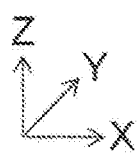

Example embodiments provide for a semiconductor device in which a self-turning ON phenomenon is suppressed and a manufacturing method thereof.

In general, according to some embodiments, a semiconductor device includes a first semiconductor region of a first conductivity type, a second semiconductor region of a second conductivity type, a third semiconductor region of the first conductivity type, a first electrode, a second insulating part, a gate electrode, and a second electrode. The second semiconductor region is provided on the first semiconductor region. The third semiconductor region is provided on the second semiconductor region. The first electrode is provided in the first semiconductor region with interposing a first insulating part. The second insulating part is provided on the first electrode. The gate electrode is provided on the second insulating part. The gate electrode has a lower surface and a first side surface. A first recess and a second recess indented upward are provided in the lower surface. The first side surface faces the second semiconductor region in a first direction via a gate insulating part. The first recess is positioned between the second recess and the first side surface in the first direction. A distance in the first direction between the first recess and the second recess is longer than a distance in the first direction between the first side surface and the first recess. The second electrode is provided on the second semiconductor region and on the third semiconductor region, and is electrically connected to the second semiconductor region, the third semiconductor region, and the first electrode.

Hereinafter, embodiments of the present disclosure will be described with reference to the drawings.

The drawings are illustrated schematically and conceptually, and a relation between thickness and width of the depicted components and/or devices and a ratio of sizes between the depicted components and/or devices are not necessarily illustrated to scale. Even in a case where a same depicted component and/or device is illustrated, the dimensions, extensions and ratios may be different than as illustrated in the drawings.

In the description and the drawings of this application, similar elements, components, devices and the like may be referred to by same reference signs, and detailed description thereof may be omitted.

Some descriptions of the embodiments are given using an XYZ orthogonal coordinate system. For example, a direction from an $n^-$ type semiconductor region 1 toward a p-type base region 2 is referred to as a Z direction, and two directions orthogonal to the Z direction are referred to as an X direction (first direction) and a Y direction, which are orthogonal to each other. This coordinate system and, at times, consistently described layout of devices and components is not meant to be limiting. Other arrangements and/or layouts of components and/or device may be used. As used herein, the term "upper portion" or "upper surface" may be used to refer to a positive Z end of a component or device, and the term "lower portion" or "lower surface" may be used to refer to a negative Z end of a component or device. The term "above" may refer to a component or device being further disposed in a positive Z direction than another component or device. The term "below" may refer to a component or device being further disposed in a negative Z direction than another component or device.

In the description below, the notations of $n^+$, $N^-$ and p indicate a relative magnitude of impurity concentration in each conductivity type. In other words, the notation attached with "+" indicates a relatively high impurity concentration, as compared to those attached with no attached "+" sign, and the notation attached with the sign "−" indicates a relatively low impurity concentration, as compared to those with no attached "−" sign.

Any of the embodiments described below may be implemented by swapping the respective "p-type" and "n-type" semiconductor regions.

(First Aspect)

FIG. 1 is a cross-sectional perspective view illustrating embodiments of a part of a semiconductor device 100 according to a first aspect.

Figure 2:
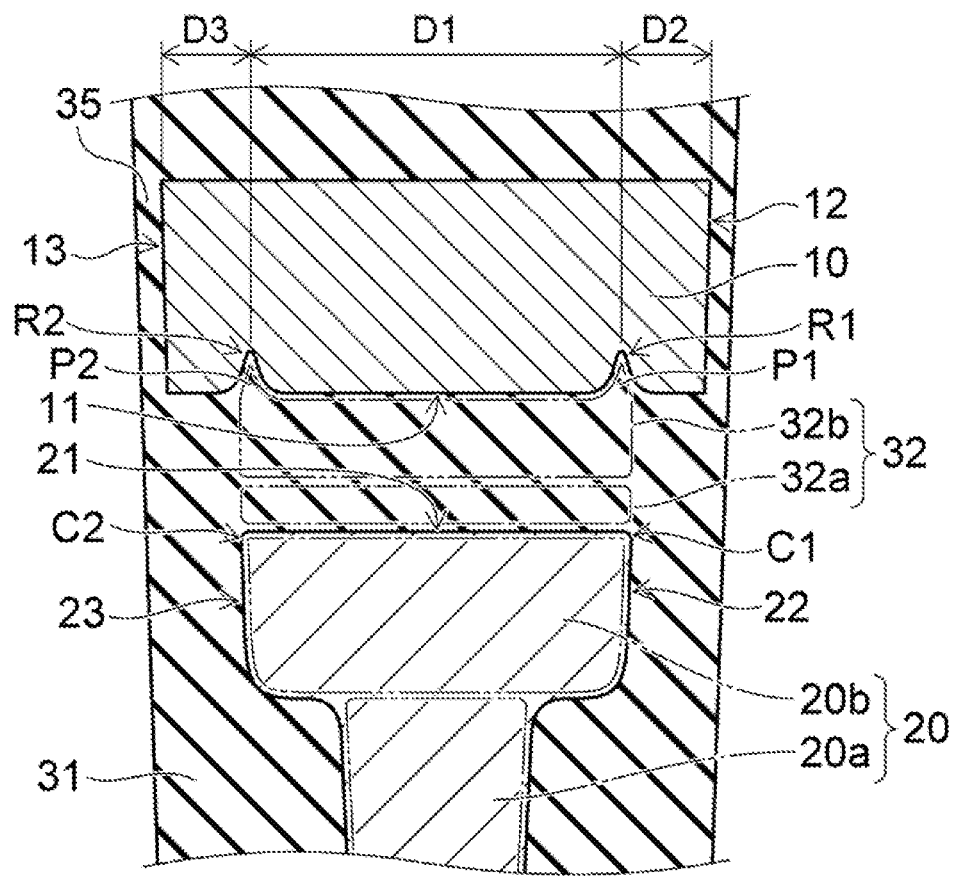
FIG. 2 is an enlarged cross-sectional view illustrating a vicinity of a gate electrode shown in FIG. 1.

FIG. 2 is an enlarged cross-sectional view illustrating a vicinity of a gate electrode 10 shown in FIG. 1.

The semiconductor device 100 is a MOSFET.

As illustrated in FIG. 1, the semiconductor device 100 includes an $n^-$ type (first conductivity type) semiconductor region 1 (first semiconductor region), a p-type (second conductivity type) base region 2 (second semiconductor region), an $n^+$ type source region 3 (third semiconductor region), an $n^+$ type drain region 4, a gate electrode 10, a field plate electrode (hereinafter, referred to as FP electrode) 20 (first electrode), an insulating part 31 (first insulating part), an insulating part 32 (second insulating part), an insulating part 33, a gate insulating part 35, a drain electrode 40, and a source electrode 41 (second electrode).

The drain electrode 40 is provided at a lower surface of the semiconductor device 100.

The $n^+$ type drain region 4 is provided on the drain electrode 40, and electrically connected to the drain electrode 40.

The $n^-$ type semiconductor region 1 is provided on the $n^+$ type drain region 4.

The p-type base region 2 is provided on the $n^-$ type semiconductor region 1.

The $n^+$ type source region 3 is provided on the p-type base region 2.

The FP electrode 20 is provided in the $n^-$ type semiconductor region 1 with the insulating part 31 interposed therebetween. The insulating part 31 is disposed between at least a portion of the FP electrode 20 and the $n^-$ type semiconductor region 1.

The insulating part 32 is provided on the FP electrode 20.

The gate electrode 10 is provided on the insulating part 32, and faces the p-type base region 2 via the gate insulating part 35 in the X direction. In other words, a surface of the gate electrode 10 is parallel to a surface of the p-type base region 2 and is distanced from the parallel surface of the p-type base region 2 in the X direction, and the gate insulating part 35 is disposed between the gate electrode 10 and the p-type base region 2.

The insulating part 33 covers apart of the n+ type source region 3 and the gate electrode 10 on an upper side of the n+ type source region 3 and the gate electrode 10.

A plurality of the p-type base regions 2, the n+ type source regions 3, the FP electrodes 20, and the gate electrodes 10 are provided along the X direction, and respectively extend in the Y direction.

Embodiments are not limited to the example configuration illustrated in FIG. 1, and the shapes and arrangement of the n+ type source regions 3, the FP electrodes 20, and the gate electrodes 10 can be changed, as appropriate. For example, a plurality of the FP electrodes 20 and the gate electrodes 10 may be provided along the X direction and along the Y direction.

The source electrode 41 is provided on the p-type base region 2 and the n+ type source region 3, and electrically connected to the p-type base region 2, the n+ type source region 3, and the FP electrode 20. The gate electrode 10 and the source electrode 41 are electrically isolated from each other by the insulating part 33.

In the following description, example materials of the respective components are be described. Use of other materials in addition to, or in place of, the materials discussed below may be appropriate in some embodiments.

The n− type semiconductor region 1, the p-type base region 2, the n+ type source region 3, and the n+ type drain region 4 contain silicon (Si) or silicon carbide (SiC) as a semiconductor material. In a case where silicon is used as the semiconductor material, arsenic (As), phosphorus (P), or antimony (Sb) may be used as an n-type impurity. Boron (B) may be used as a p-type impurity.

The gate electrode 10 and the FP electrode 20 contain a semiconductor material such as polysilicon.

The insulating parts 31 to 33 and the gate insulating part 35 contain silicon oxide (SiO2) as an insulating material. Other materials contained in the insulating parts 31 to 33 will be described below.

The drain electrode 40 and the source electrode 41 contain metal such as aluminum (Al).

As illustrated in FIG. 2, the gate electrode 10 has a lower surface 11, a side surface 12 (first side surface), and a side surface 13 on a side opposite to the side surface 12. The side surfaces 12 and 13 face p-type base regions 2 via the gate insulating part 35, respectively. In the lower surface 11, recesses R1 and R2 indented upward are provided. The recesses R1 and R2 are defined by the gate electrode 10. The recesses R1 and R2 are separated in the X direction. The recess R1 is positioned between the side surface 12 and the recess R2 in the X direction, and the recess R2 is positioned between the side surface 13 and the recess R1 in the X direction.

A distance D1 in the X direction between the recesses R1 and R2 is longer than a distance D2 in the X direction between the side surface 12 and the recess R1, and longer than a distance D3 in the X direction between the side surface 13 and the recess R2. The distances D1 to D3 can be measured based on the most indented positions (where the positions in the Z direction are at highest points) of the respective recesses, for example.

The insulating part 32 includes a first insulating portion 32a and a second insulating portion 32b. The first insulating portion 32a is positioned between the FP electrode 20 and the second insulating portion 32b in the Z direction (vertical direction). The second insulating portion 32b is positioned between the first insulating portion 32a and the gate electrode 10 in the Z direction.

The second insulating portion 32b contains a higher concentration of boron than any of the insulating part 31, the first insulating portion 32a, and the gate insulating part 35. A dielectric constant of the second insulating portion 32b is higher than a dielectric constant of any of the insulating part 31, the first insulating portion 32a, and the gate insulating part 35. The insulating part 31, the first insulating portion 32a, and the gate insulating part 35 are formed to be more dense than the second insulating portion 32b.

The second insulating portion 32b includes projections P1 and P2 which protrude upward. The projections P1 and P2 are separated in the X direction. The projection P1 is provided inside the recess R1, and the projection P2 is provided inside the recess R2.

A length in the X direction of the second insulating portion 32b is longer than the distance D1. The thickness in the Z direction of the second insulating portion 32b between the projections P1 and P2 is thicker than the thickness in the Z direction of the first insulating portion 32a.

The FP electrode 20 includes a first electrode portion 20a and a second electrode portion 20b. The second electrode portion 20b is provided on the first electrode portion 20a. The length in the X direction of the second electrode portion 20b is longer than the length in the X direction of the first electrode portion 20a. The length in the X direction of the first electrode portion 20a is shorter than the distance D1, for example.

The FP electrode 20 includes an upper surface 21, a side surface 22 (second side surface), and a side surface 23 (third side surface) on a side opposite to the side surface 22. In the example illustrated in FIGS. 1 and 2, the side surfaces 22 and 23 are side surfaces of the second electrode portion 20b. The recess R1 and the projection P1 are in line with a corner C1 in the Z direction between the upper surface 21 and the side surface 22. The recess R2 and the projection P2 are in line with a corner C2 in the Z direction between the upper surface 21 and the side surface 23.

Next, embodiments of a manner of operation of the semiconductor device 100 will be described.

When a voltage equal to or more than a threshold is applied to the gate electrode 10 in a state where a voltage which is positive with respect to the source electrode 41 is applied to the drain electrode 40, a channel (inversion layer) is formed in the p-type base region 2 in the vicinity of the gate insulating part 35, and the semiconductor device 100 enters an ON state. The electrons flow from the source electrode 41 toward the drain electrode 40 via the channel. Thereafter, when the voltage applied to the gate electrode 10 is lower than the threshold, the channel in the p-type base region 2 disappears, and the semiconductor device 100 enters an OFF state.

When the semiconductor device 100 is in the OFF state and a potential which is positive with respect to the source electrode 41 is applied to the drain electrode 40, a depletion layer extends from the boundary surface between the insulating part 31 and the n− type semiconductor region 1 into the n− type semiconductor region 1. A breakdown voltage of the semiconductor device 100 can be increased by formation of the depletion layer which is extended in the n type semiconductor region 1. Alternatively, the n-type impurity concentration in the n− type semiconductor region 1 is increased in accordance with an increase in the breakdown voltage of the semiconductor device 100, and thus the ON-state resistance of the semiconductor device 100 can be reduced.

Next, embodiments of a method of manufacturing the semiconductor device 100 according to the first aspect will be described with reference to FIGS. 3A to 7B.

FIGS. 3A to 7B are cross-sectional views illustrating embodiments of a manufacturing process of the semiconductor device 100 according to the first aspect.

In FIGS. 4A to 6B, an upper portion (an upper portion of the FP electrode 20) of a trench T1 is illustrated on a magnified scale.

Figure 3A:
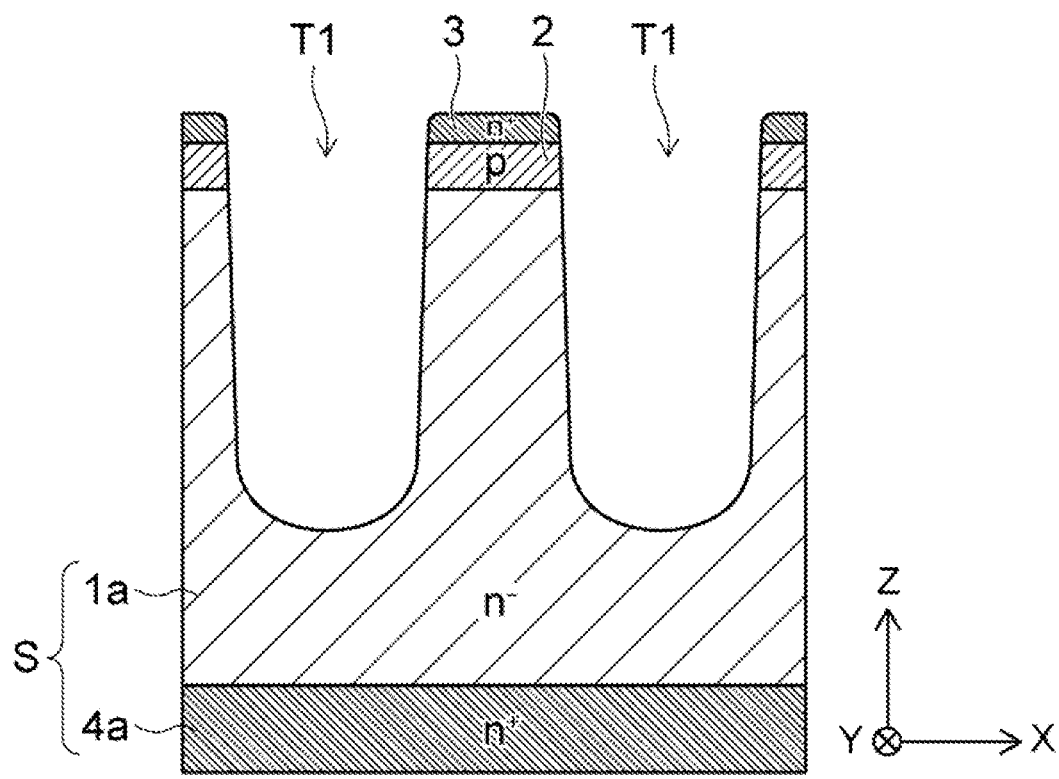
FIG. 3A and FIG. 3B are cross-sectional views illustrating embodiments of a manufacturing process of the semiconductor device according to the first aspect.

First, a semiconductor substrate S is prepared, which includes an $n^-$ type semiconductor layer 1a and an $n^+$ type semiconductor layer 4a. The $n^-$ type semiconductor layer 1a and the $n^+$ type semiconductor layer 4a contain silicon as the semiconductor material. Next, ions of the p-type impurity and the n-type impurity are implanted into the upper surface of the $n^-$ type semiconductor layer 1a to form the p-type base region 2 and the $n^+$ type source region 3. Subsequently, as illustrated in FIG. 3A, the trench T1 passing through the p-type base region 2 and the $n^+$ type source region 3 is formed in the $n^-$ type semiconductor layer 1a. The trench T1 is defined by the p-type base region 2, the $n^+$ type source region 3 and the $n^-$ type semiconductor layer 1a.

Next, an insulating layer IL1 is formed along the inner wall of the trench T1. Subsequently, a conductive layer is formed on the insulating layer IL1. The conductive layer is etched to form the FP electrode 20 in the trench T1 as illustrated in FIG. 3B.

Figure 3B:
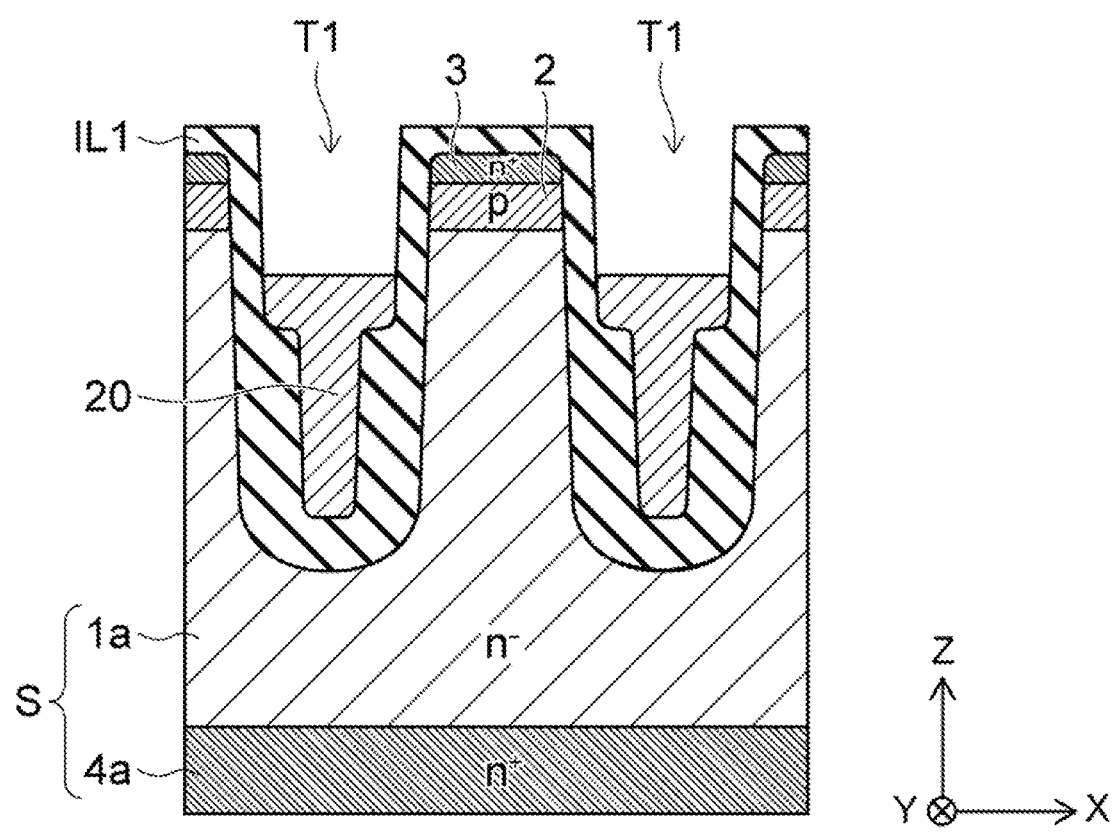

In the example illustrated in FIG. 3B, the insulating layer IL1 is formed such that the thickness thereof in the upper portion and the thickness thereof in the lower portion of the trench T1 is different. Such an insulating layer IL1 is, for example, formed by forming an insulating layer along an inner wall of the trench T1 having substantially uniform thickness. A portion of the insulating layer in the upper portion of the trench T1 is removed, thus thinning the portion of the insulating layer in the upper portion of the trench T1, and the process is repeated. In this manner, the insulating layer IL1 is formed having a configuration in which a plurality of insulating layers are stacked in the lower portion of the trench T1.

Subsequently, the conductive layer is formed on the insulating layer IL1, and then etching is performed on the conductive layer, forming the FP electrode 20. The width of the FP electrode 20 is different at a top portion of the FP electrode 20 than at a bottom portion of the FP electrode 20. Alternatively, the FP electrode 20 may be formed on an insulating layer IL1 which has substantially uniform thickness. In this case, the widths of the upper portion and the lower portion of the FP electrode 20 are formed to be substantially equal.

Figure 4A:
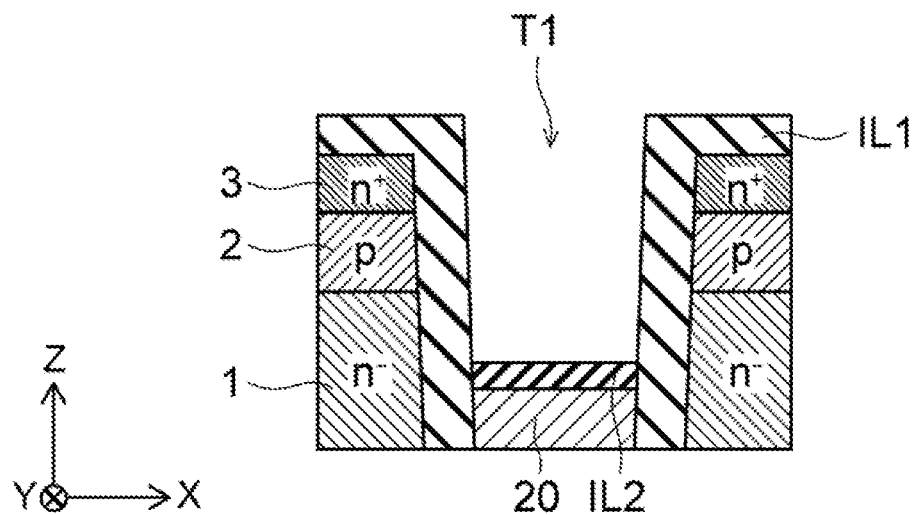
FIG. 4A, FIG. 4B, and FIG. 4C are cross-sectional views illustrating embodiments of a manufacturing process of the semiconductor device according to the first aspect.

Next, an insulating layer IL2 is formed on the upper surface of the FP electrode 20 by performing thermal oxidation, as illustrated in FIG. 4A. The insulating layer IL2 is formed thinner than the insulating layer IL1 which is formed in the upper portion of the trench T1.

Figure 4B:
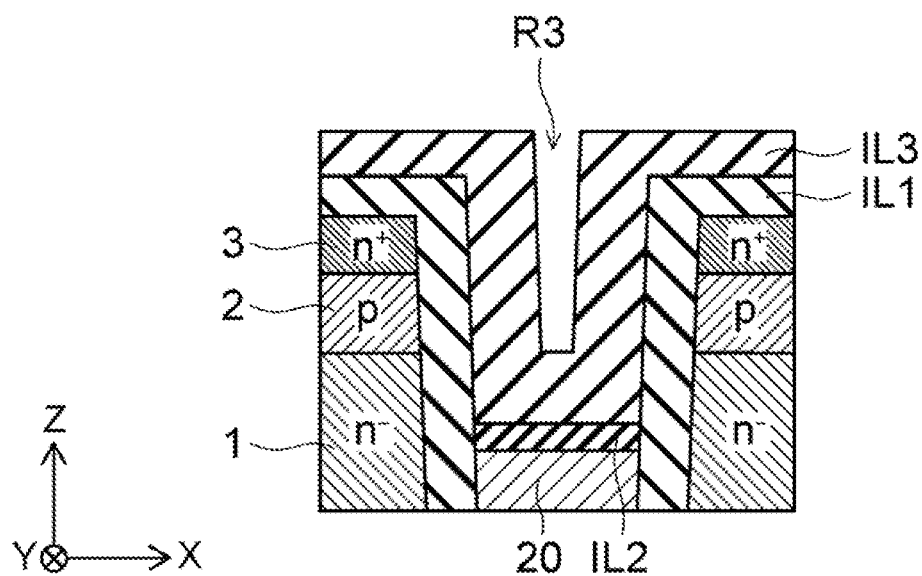

Next, an insulating layer IL3 is formed along the surfaces of the insulating layers IL1 and IL2 by a CVD (Chemical Vapor Deposition) method. At this time, the insulating layer IL3 is formed such that the trench T1 is not completely filled, as illustrated in FIG. 4B. Thus, a recess R3 is formed in the upper surface of the insulating layer IL3 extending into the trench T1.

Figure 4C:
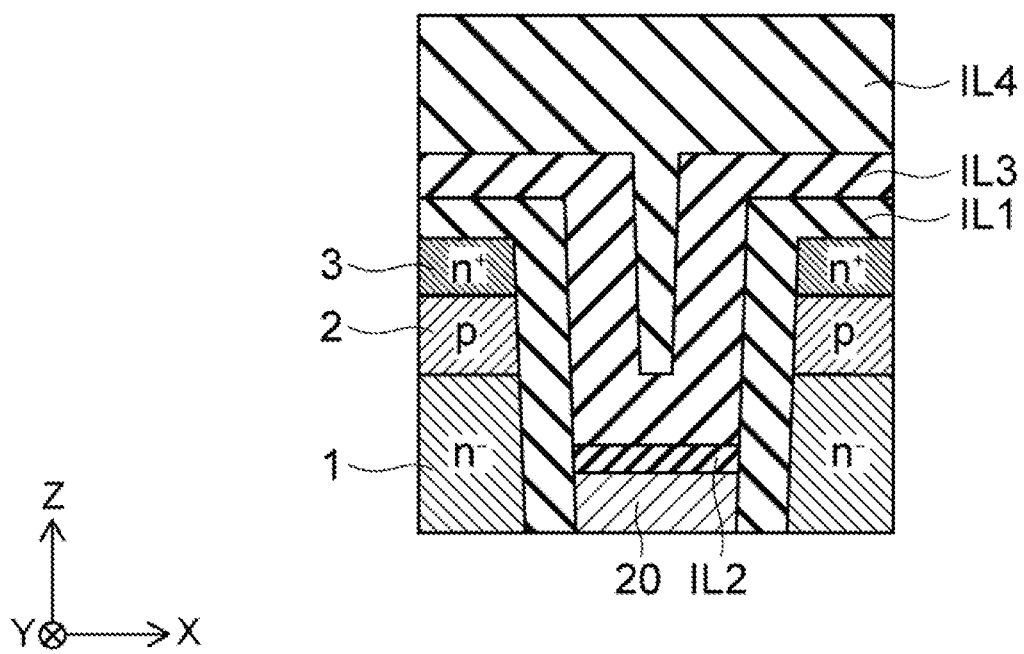

Subsequently, an insulating layer IL4 is formed on the insulating layer IL3, and the insulating layer IL4 is subjected to heating and reflow. Thus, as illustrated in FIG. 4C, the recess R3 in the upper surface of the insulating layer IL3 is filled by the insulating layer IL4, and the upper surface of the insulating layer IL4 is made to be substantially flat.

In the subsequent processes illustrated in FIGS. 5A to 6B, parts of the insulating layers IL1 and IL3, and the insulating layer IL4 are isotropically etched and removed. As an example of the isotropic etching, a wet etching in which hydrofluoric acid can be used.

The materials of the insulating layers ILL IL3, and IL4 are selected such that the etching rates of the insulating layers IL1 and IL4 are higher than the etching rates of the insulating layer IL3 in a given etching process.

Example materials for achieving such a relation of etching rates are described below.

The insulating layer IL1 is formed by the thermal oxidation on the $n^-$ type semiconductor layer 1a, and thus is made of a silicon oxide which is formed densely.

In the insulating layer IL3, boron as the insulating material is added to the silicon oxide. Therefore, the insulating layer IL3 contains boron in greater concentration than does the insulating layers IL1 and IL2.

In the insulating layer IL4, boron and phosphorous are added to the silicon oxide, which is the insulating material. The concentration of boron added to the insulating layer IL4 is higher than the concentration of boron added to the insulating layer IL3. In other words, the insulating layer IL4 contains boron and phosphorous in higher concentration than do any of the insulating layers IL1, IL2, and IL3.

The etching on the respective insulating layers will be specifically described with reference to FIGS. 5A to 6B.

Figure 5A:
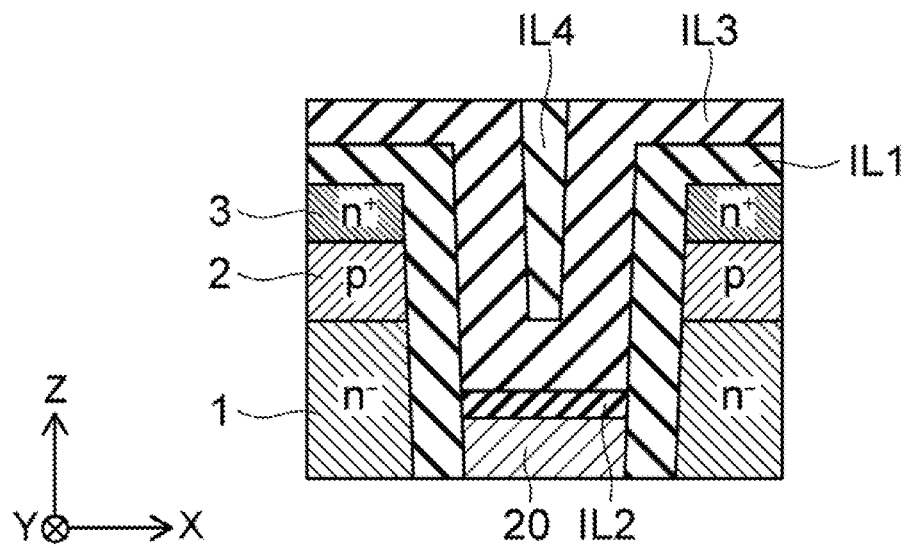
FIG. 5A, FIG. 5B and FIG. 5C are cross-sectional views illustrating embodiments of a manufacturing process of the semiconductor device according to the first aspect.
Figure 5B:
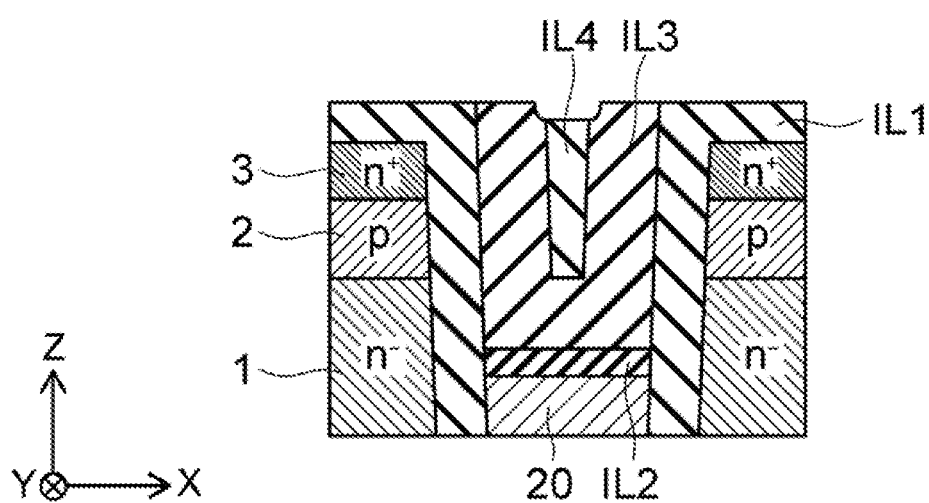

When the wet etching starts, the surface of the uppermost insulating layer IL4 is first retracted to expose the upper surface of the insulating layer IL3 as illustrated in FIG. 5A. In this state, when the upper surfaces of the insulating layers IL3 and IL4 are retracted by the wet etching, the upper surface of the insulating layer IL1 is exposed as illustrated in FIG. 5B.

As described above, the etching rate of the insulating layer IL4 is higher than the etching rate of the insulating layer IL3. Therefore, the speed at which the upper surface of the insulating layer IL4 is retracted is faster than the speed at which the upper surface of the insulating layer IL3 is retracted. The upper surface of the insulating layer IL4 is retracted faster than the upper surface of the insulating layer IL3, and at least a portion of the side surface of the insulating layer IL3 covered by the insulating layer IL4 becomes exposed. Then, the etching progresses in the horizontal direction from the exposed side surface (horizontally into the insulating layer IL3) as illustrated in FIG. 5B.

Figure 5C:
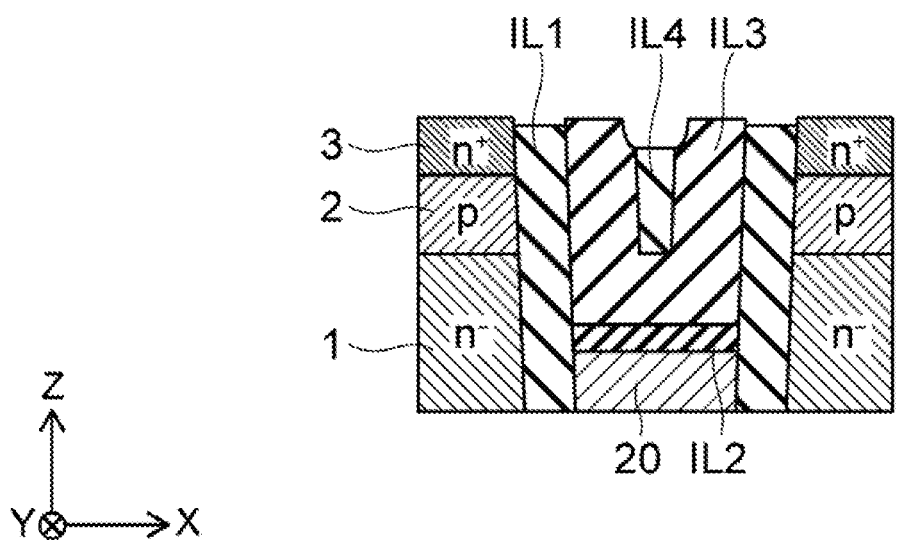

When the wet etching proceeds in this manner, the upper surfaces of each of the insulating layers IL1, IL3, and IL4 are retracted. The etching rate of the insulating layer IL1 is higher than the etching rate of the insulating layer IL3. Therefore, as illustrated in FIG. 5C, the upper surface of the insulating layer IL4 is retracted faster than the upper surface of the insulating layer IL3, and thus retracts more over a given period of etching time.

Figure 6A:
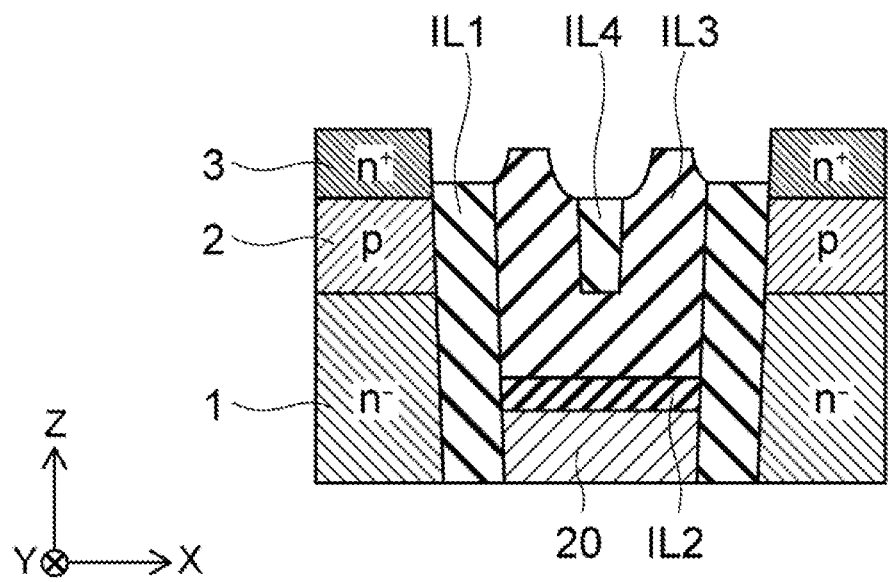
FIG. 6A and FIG. 6B are cross-sectional views illustrating embodiments of a manufacturing process of the semiconductor device according to the first aspect.

When the side surface of the insulating layer IL3 covered by the insulating layer IL1 becomes exposed, the etching is performed isotropically from the exposed side surface as illustrated in FIG. 6A. In other words, the upper surface of the insulating layer IL3 is retracted and the etching continues in the horizontal direction into both side surfaces of the IL3 respectively abutting the insulating layers IL1 and IL4. As a result, when the insulating layer IL4 is removed, the projections P1 and P2 are formed in the upper surface of the insulating layer IL3 as illustrated in FIG. 6B.

Figure 6B:
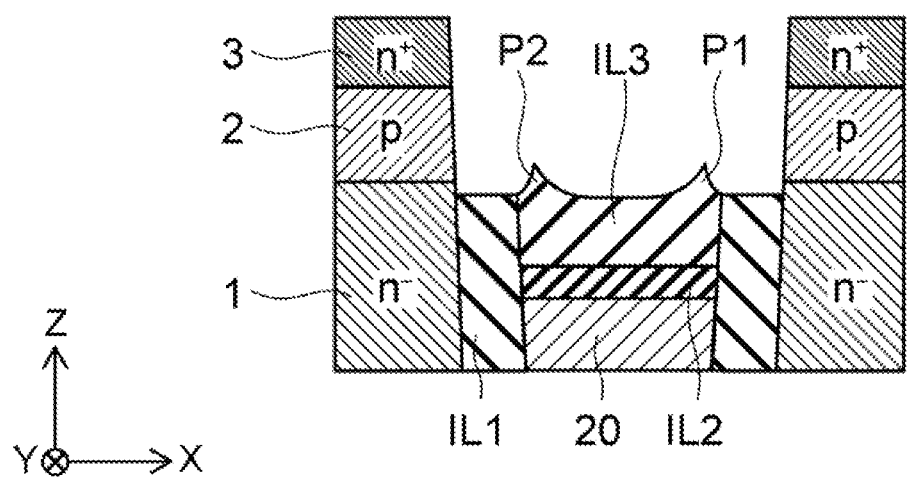

In the configuration illustrated in FIG. 6B, the insulating layer IL2 on the FP electrode 20 corresponds to the first insulating portion 32a, and the insulating layer IL3 having the projections P1 and P2 corresponds to the second insulating portion 32b.

Figure 7A:
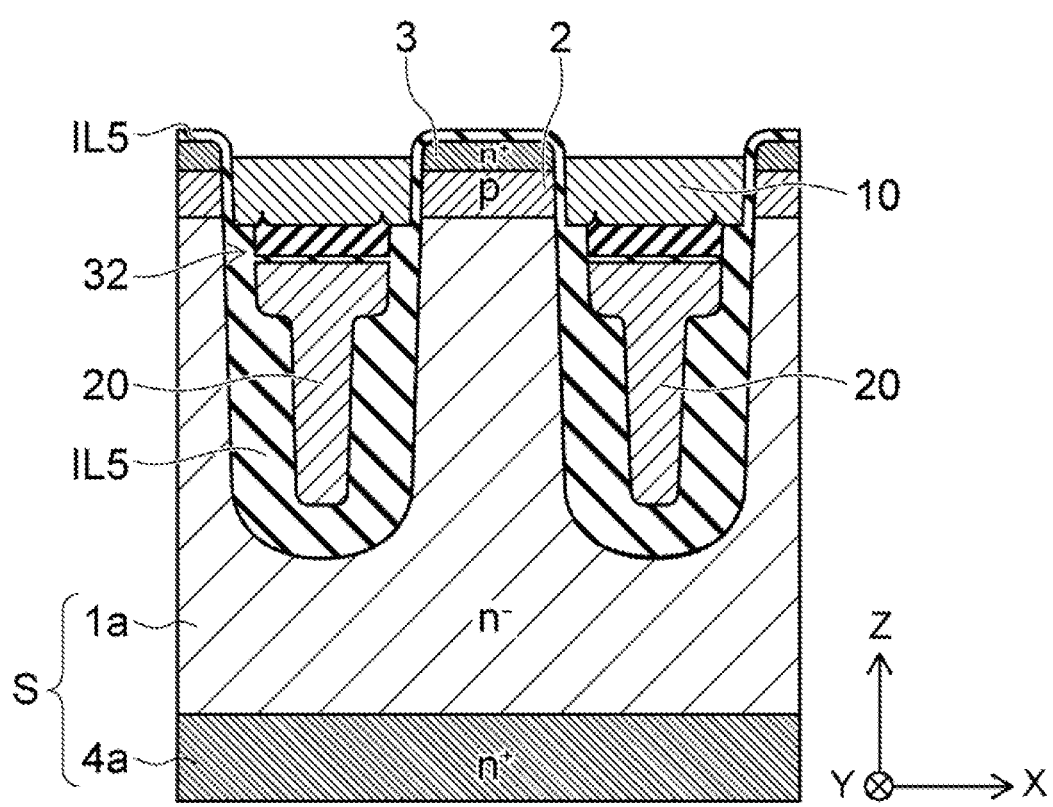
FIG. 7A and FIG. 7B are cross-sectional views illustrating embodiments of a manufacturing process of the semiconductor device according to the first aspect.

Next, an insulating layer IL5 is formed on the surface of the n⁻ type semiconductor layer 1a, the p-type base region 2, and the n⁺ type source region 3, which are exposed by thermally oxidizing the semiconductor substrate S. The insulating layer IL5 is formed thinner than the insulating layers IL1 and IL3. Subsequently, as illustrated in FIG. 7A, the gate electrode 10 is formed between the adjacent insulating layers IL5 (adjacent in the X direction), on the insulating layers IL1, IL2 and IL3.

The gate electrode 10 is formed directly on the projections P1 and P2. Thus, a part of the gate electrode 10 is indented or penetrated by the projections P1 and P2, and the recesses R1 and R2 are thus formed.

Figure 7B:
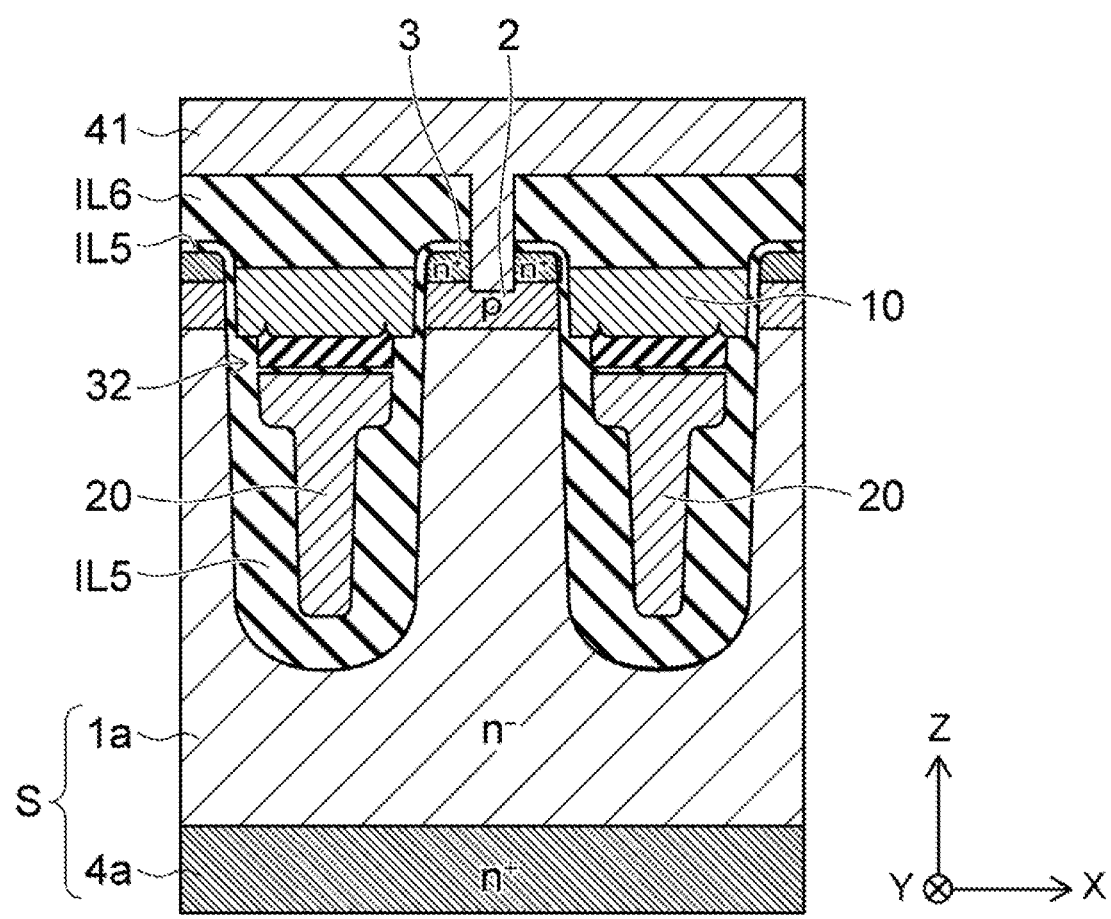

Next, an insulating layer IL6 is formed to cover the gate electrode 10 and the insulating layer IL5. Subsequently, a trench is formed passing through the n⁺ type source region 3 and the insulating layers IL5 and IL6, reaching the p-type base region 2. Subsequently, a metal layer is formed to cover the insulating layer IL6 so that the trench is filled. Then, the metal layer is etched to form the source electrode 41 as illustrated in FIG. 7B.

Thereafter, the rear surface of the n⁺ type semiconductor layer 4a is polished until the n⁺ type semiconductor layer 4a has a predetermined thickness. Subsequently, the semiconductor device 100 illustrated in FIGS. 1 and 2 is completed by forming the drain electrode 40 on the rear (lower) surface of the n⁺ type semiconductor layer 4a.

Herein, advantages of embodiments according to the first aspect will be described with reference to FIGS. 8A to 9B.

Figure 8A:
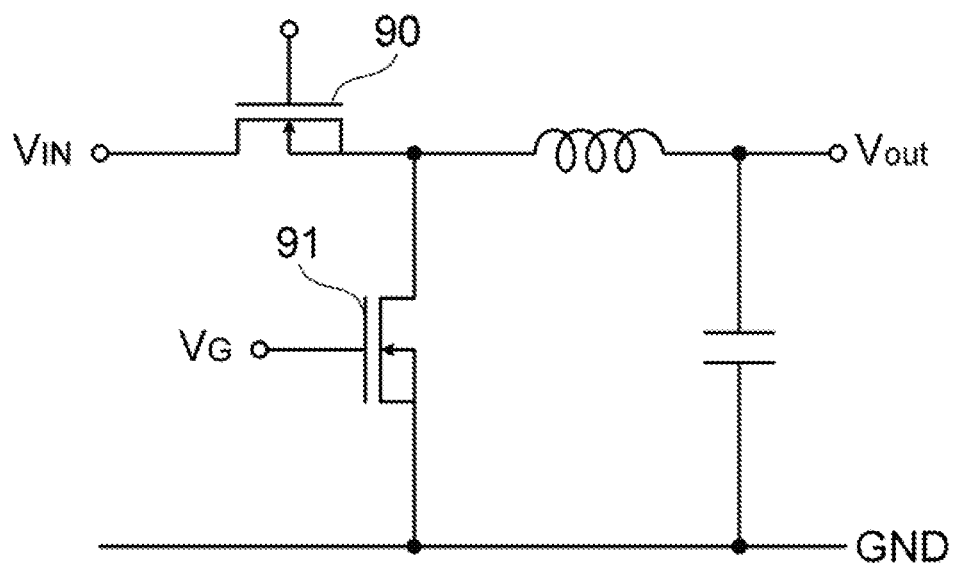
FIG. 8A is a diagram illustrating embodiments of an exemplary circuit which uses the semiconductor device.
Figure 8B:
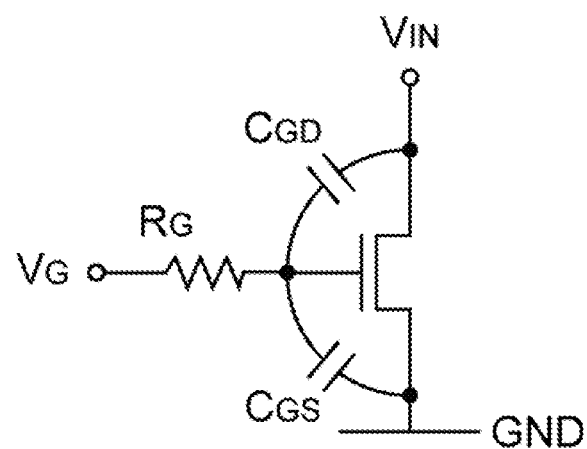
FIG. 8B is a diagram illustrating embodiments of an equivalent circuit of the semiconductor device.

FIG. 8A illustrates an example circuit which uses a semiconductor device according to the first aspect, and FIG. 8B illustrates an equivalent circuit of the semiconductor device.

Figure 9A:
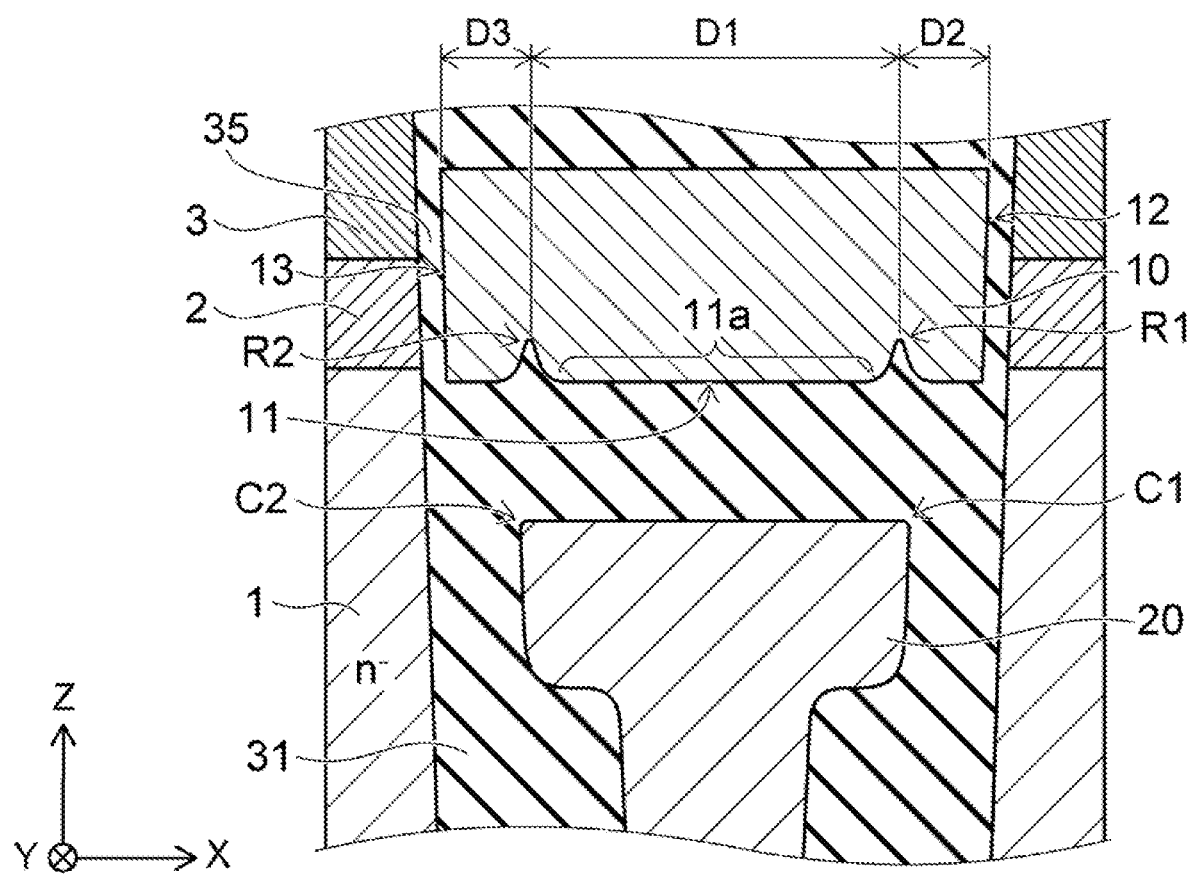
FIG. 9A is a cross-sectional view illustrating embodiments of a part of the semiconductor device according to the first aspect.
Figure 9B:
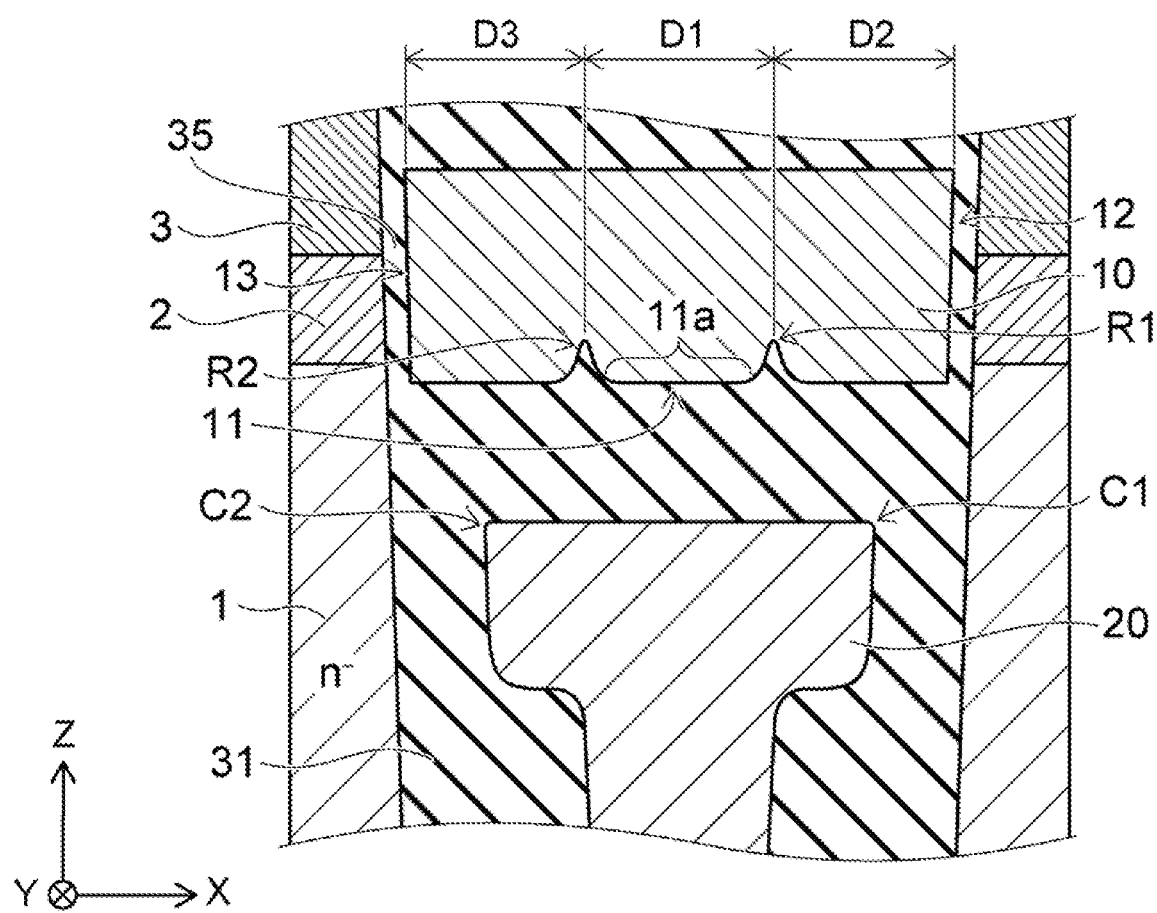
FIG. 9B is a cross-sectional view illustrating embodiments of a part of a semiconductor device according to a reference example.

FIG. 9A is a cross-sectional view illustrating a part of the semiconductor device 100 according embodiments of the first aspect, and FIG. 9B is a cross-sectional view illustrating a part of a semiconductor device 100R according to a reference example.

In the circuit illustrated in FIG. 8A, two MOSFETs 90 and 91 are used in a main switching circuit of a DC-DC converter. In the circuit illustrated in FIG. 8A, when the MOSFET 91 is in the OFF state, and the MOSFET 90 enters the ON state, the voltage of the MOSFET 91 on the drain electrode side rises up to VIN.

As illustrated in FIG. 8B, a gate-drain capacitance CGD between the drain electrode and the gate electrode, a gate-source capacitance CGS between the gate electrode and the source electrode, and a gate resistance RG are present in the MOSFET. When the voltage VIN is input to the drain electrode, a gate voltage VG rises up to a value expressed by the following equation.

$$V_G = \{C_G/(C_{GS}+C_{GD})\} \times V_{IN} \quad (1)$$

When the gate voltage $V_G$ becomes equal to or more than a threshold voltage, the MOSFET 91 can unintentionally enter the ON state, and current flows through the MOSFETs 90 and 91. Thus, a loss of current and/or power can occur. In order to prevent the self-turning ON of the MOSFET, it is desirable that the gate-source capacitance CGS be increased, or the gate-drain capacitance CGD be decreased, or that both conditions be achieved, as can be seen from Equation (1).

FIG. 9A is a cross-sectional view illustrating embodiments of a part of the semiconductor device 100 according to the first aspect, and FIG. 9B is a cross-sectional view illustrating embodiments of a part of the semiconductor device 100R according to the reference example.

The recesses R1 and R2 are formed in the lower surface 11 of the gate electrode 10 and are defined by the electrode 10 in both of the semiconductor devices 100 and 100R. In the semiconductor device 100, the distance D1 is longer than either of the distances D2 and D3, as illustrated in FIG. 9A. On the contrary, in the semiconductor device 100R, the distance D1 is shorter than either of the distances D2 and D3, as illustrated in FIG. 9B.

In a case where the distances D1 to D3 are in a relation illustrated in FIG. 9A (the distance D1 is longer than either of the distances D2 and D3), the area of a region 11a of the lower surface 11 positioned between the recesses R1 and R2 becomes large, as compared to the case where the distances D1 to D3 are in the relation illustrated in FIG. 9B (the distance D1 is shorter than either of the distances D2 and D3). The region 11a faces the upper surface 21 of the FP electrode 20. Therefore, in a case where the distances D1 to D3 satisfy the relation illustrated in FIG. 9A, the gate-source capacitance between the gate electrode 10 and the FP electrode 20 can be increased, as compared to the case where the distances D1 to D3 are in the relation illustrated in FIG. 9B.

Since the FP electrode 20 is electrically connected to the source electrode 41, an increasing of the capacitance between the gate electrode 10 and the FP electrode 20 leads to an increasing of the gate-source capacitance CGS between the gate electrode 10 and the source electrode 41.

The gate electrode 10 faces the n type semiconductor region 1 via the insulating layers 31 and 32 and the gate insulating layer 35. Thus, the gate-drain capacitance CGD between the gate electrode 10 and the n⁻ type semiconductor region 1 is formed with at least one of the insulating layers 31 and 32 and the gate insulating layer 35 serving as a dielectric material). In a portion of the gate electrode 10 where the recesses R1 and R2 are formed, a distance between the gate electrode 10 and the n⁻ type semiconductor region 1 is locally lengthened. Therefore, the gate-drain capacitance CGD of these portions becomes smaller than would otherwise be the case.

A reduction amount of the gate-drain capacitance CGD due to the presence of the recesses R1 and R2 becomes large as the recesses R1 and R2 approach the n⁻ type semiconductor region 1 (e.g. the closer the recesses R1 and R2 are to a side surface of the gate electrode 10). Therefore, the reduction amount of the gate-drain capacitance CGD due to the presence of the recesses R1 and R2 can be made large by providing the recesses R1 and R2 near the side surfaces 12 and 13, respectively, so as to make the distances D2 and D3 shorter than the distance D1.

Thus, according to the configuration of the semiconductor device of the embodiments illustrated in FIG. 9A, it is possible to decrease the gate-drain capacitance CGD, as compared to the configuration illustrated in FIG. 9B.

As described using FIGS. 8A and 8B, in order to prevent the self-turning ON of the MOSFET, it is desirable that the gate-source capacitance CGS be increased, or the gate-drain capacitance CGD be decreased, or that both conditions be achieved.

According to some embodiments, the gate-drain capacitance CGD can be made small while increasing the gate-source capacitance CGS as described above. Therefore, according to this embodiment, it is possible to suppress the self-turning ON phenomenon, as compared to the semiconductor device according to the reference example.

When a voltage is applied to the gate electrode 10, due to a potential difference between the gate electrode 10 and the FP electrode 20, an electric field is generated between the gate electrode 10 and the FP electrode 20. The electric field tends to concentrate in a vicinity of the corners C1 and C2 of the upper portion of the FP electrode 20. In order to prevent dielectric breakdown due to the concentration of electric field, the distance between the gate electrode 10 and the FP electrode 20 can be made long.

However, when the thickness of the insulating part 32 between the gate electrode 10 and the FP electrode 20 is increased as a whole, the gate-source capacitance CGS is lowered.

In this regard, in embodiments of the semiconductor device 100 according to the first aspect, the corner C1 and the recess R1 are substantially in a line (lined up) in the Z direction, and the corner C2 and the recess R2 are substantially in a line in the Z direction. Thus, in the locations where the corners C1 and C2 are provided and the concentration of electric field tends to be high, the distance between the gate electrode 10 and the FP electrode 20 is locally lengthened.

Therefore, according to this aspect, it is possible to alleviate the concentration of electric field in the FP electrode 20 while suppressing the reduction of the gate-source capacitance CGS.

Furthermore, the insulating part 32 provided between the gate electrode 10 and the FP electrode 20 includes the second insulating portion 32b. The second insulating portion 32b contains boron in higher concentration than does the first insulating portion 32a, and the dielectric constant of the second insulating portion 32b is higher than those of any of the first insulating portion 32a and the insulating part 31. As the dielectric constant of the insulator provided between the gate electrode 10 and the FP electrode 20 becomes large, a larger dielectric polarization is generated, and the charges generated in the gate electrode 10 and the FP electrode 20 are more effectively cancelled. Therefore, it is possible to alleviate the concentration of electric field in the vicinity of the corners C1 and C2 still further by providing a second insulating portion 32b having a dielectric constant higher than a dielectric constant of other insulating parts on the corners C1 and C2.

By embodiments of the manufacturing method according to the first aspect, the projections P1 and P2 are formed in the upper surface of the insulating layer IL2 using at least three insulating layers having different etching rates, and the gate electrode 10 having the recesses R1 and R2 is formed using these projections. According to these embodiments, it is possible to form the gate electrode 10 having the recesses R1 and R2 with such a method.

By embodiments of the manufacturing method according to the first aspect, it is possible to control the positions of the projections P1 and P2 which are formed in the upper surface of the insulating layer IL3 by adjusting the respective film thicknesses of the insulating layers IL1 and IL3.

In other words, as the insulating layer IL1 in the upper portion of the trench T1 is formed thinner, the projections P1 and P2 are respectively formed at positions nearer to the inner wall of the trench T1. As the insulating layer IL3 is formed thinner, the projections P1 and P2 are respectively formed at positions nearer to the inner wall of the trench T1.

Next, a modification of embodiments according to the first aspect will be described with reference to FIGS. 10A to 12B.

FIGS. 10A to 12B are cross-sectional views illustrating embodiments of apart of the semiconductor device according to the modification of the first aspect.

In FIGS. 10A to 12B, the vicinity of the gate electrode 10 of the depicted semiconductor devices is illustrated on a magnified scale.

Figure 10A:
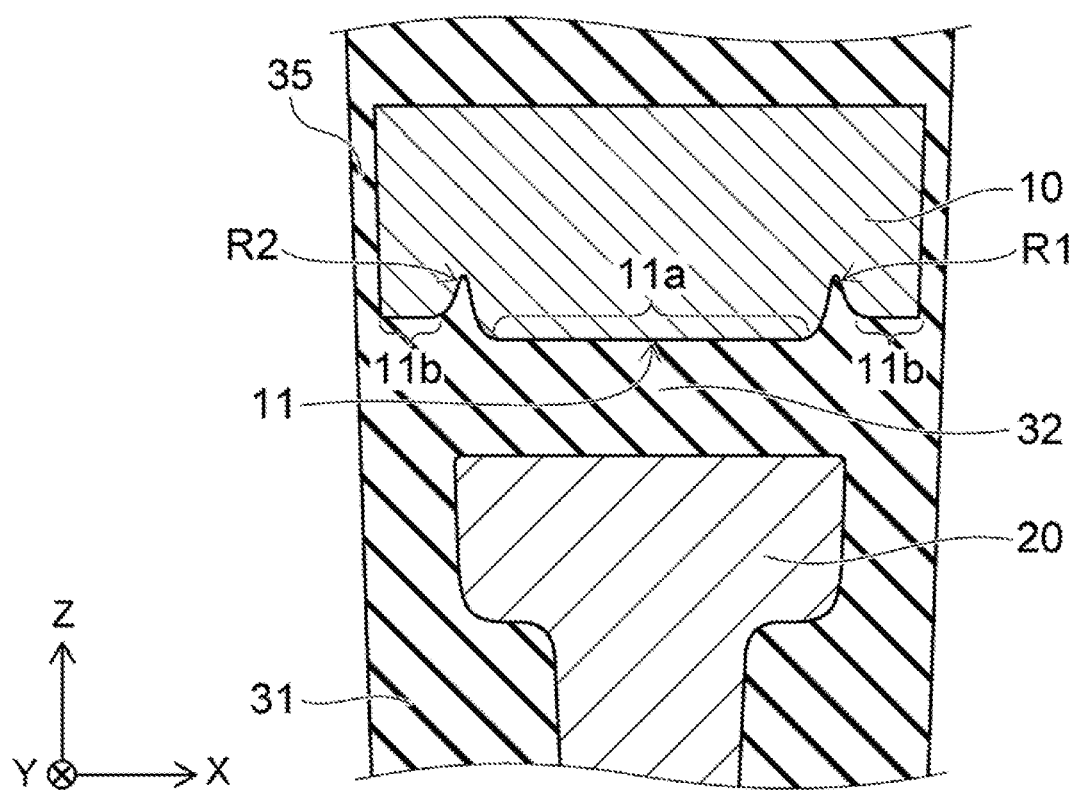
FIG. 10A and FIG. 10B are cross-sectional views illustrating embodiments of a part of a semiconductor device according to a modification of the first aspect.

In the example illustrated in FIG. 10A, the region 11a of the lower surface 11 between the recesses R1 and R2 is positioned lower than two regions 11b between the recess R1 and the side surface 12, and between the recess R2 and the side surface 13, respectively.

The gate-source capacitance CGS can be made larger by shortening the distance between the lower surface of the gate electrode 10 and the upper surface of the FP electrode 20. On the other hand, the region 11b positioned above the corners C1 and C2 of the FP electrode 20 is desirably provided in the vicinity of the FP electrode 20 in order to suppress the concentration of electric field in the corners C1 and C2.

In this regard, according to the configuration illustrated in FIG. 10A, the gate-source capacitance can be made larger while suppressing the concentration of electric field in the corners C1 and C2 by positioning the region 11a below the region 11b.

Figure 10B:
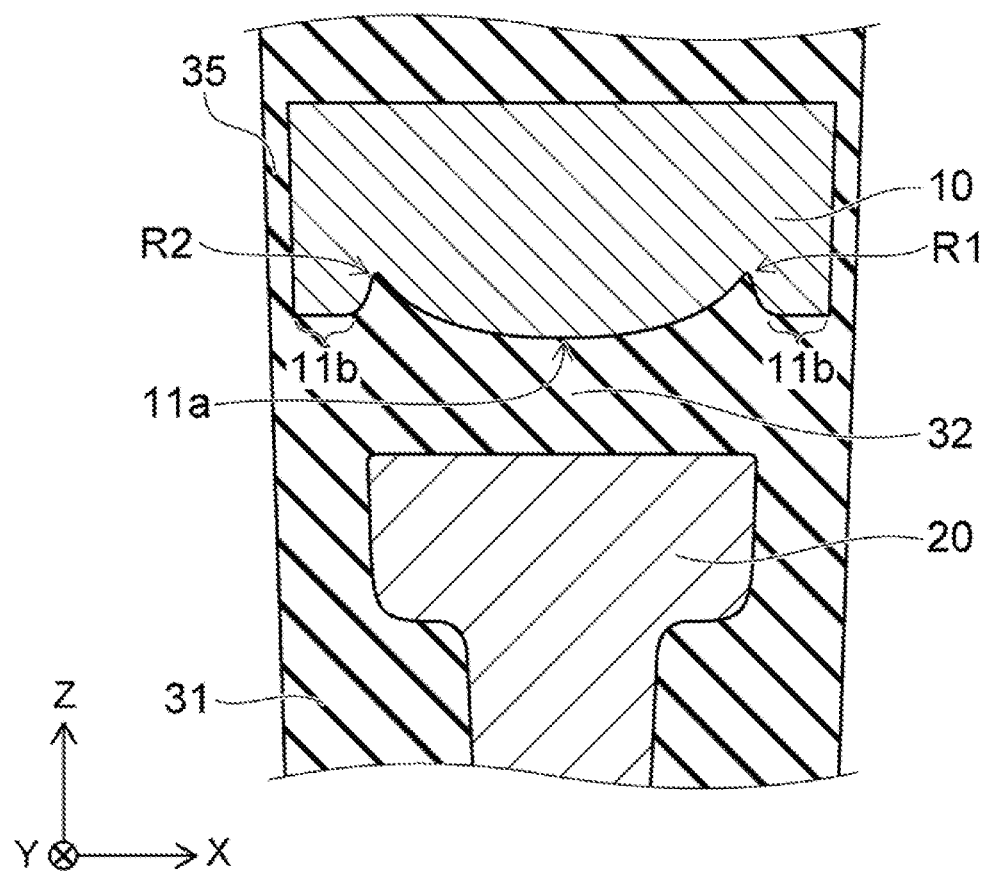

As illustrated in FIG. 10B, the region 11a may be downwardly bent in a convex shape. Other configurations are also possible. A part of the region 11a may be formed flat, and another part may be bent downwardly. Similarly, the region 11b may be downwardly bent in the convex shape.

Figure 11A:
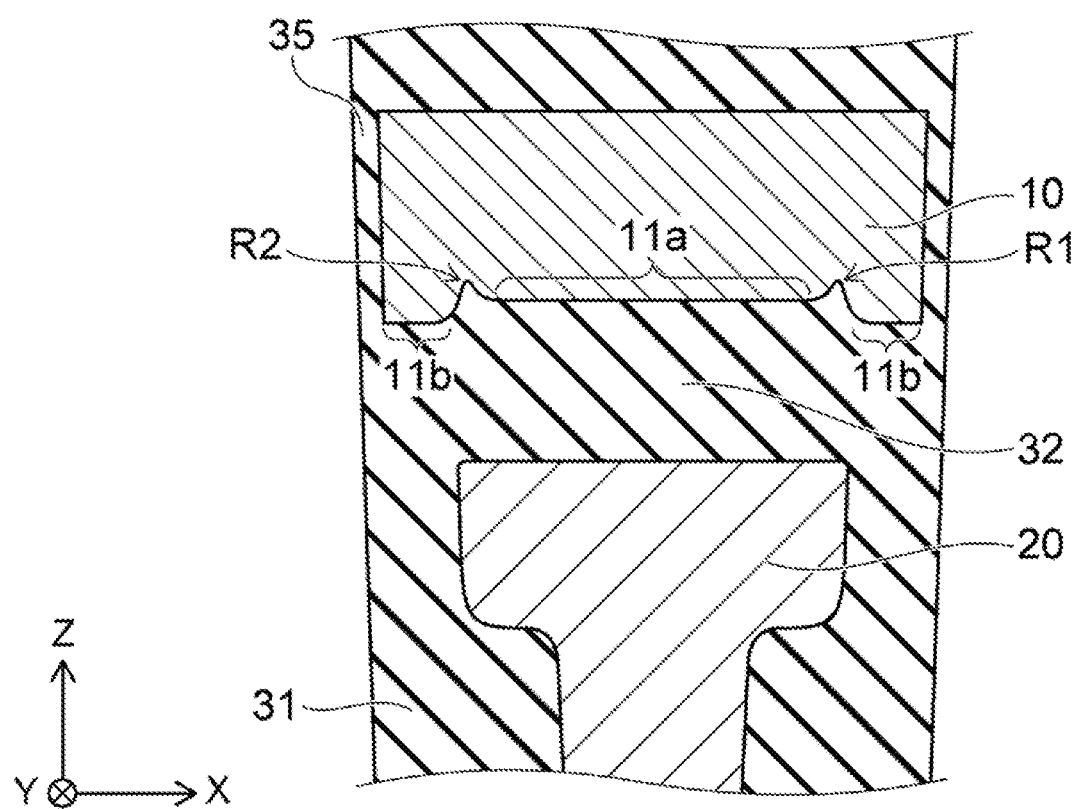
FIG. 11A and FIG. 11B are cross-sectional views illustrating embodiments of apart of the semiconductor device according to the modification of the first aspect.

In the example illustrated in FIG. 11A, the region 11a is positioned above the region 11b. In the example illustrated in FIG. 11B, the region 11a is positioned further in the positive Z direction than is the region 11a depicted in the example illustrated in FIG. 11A.

Figure 11B:
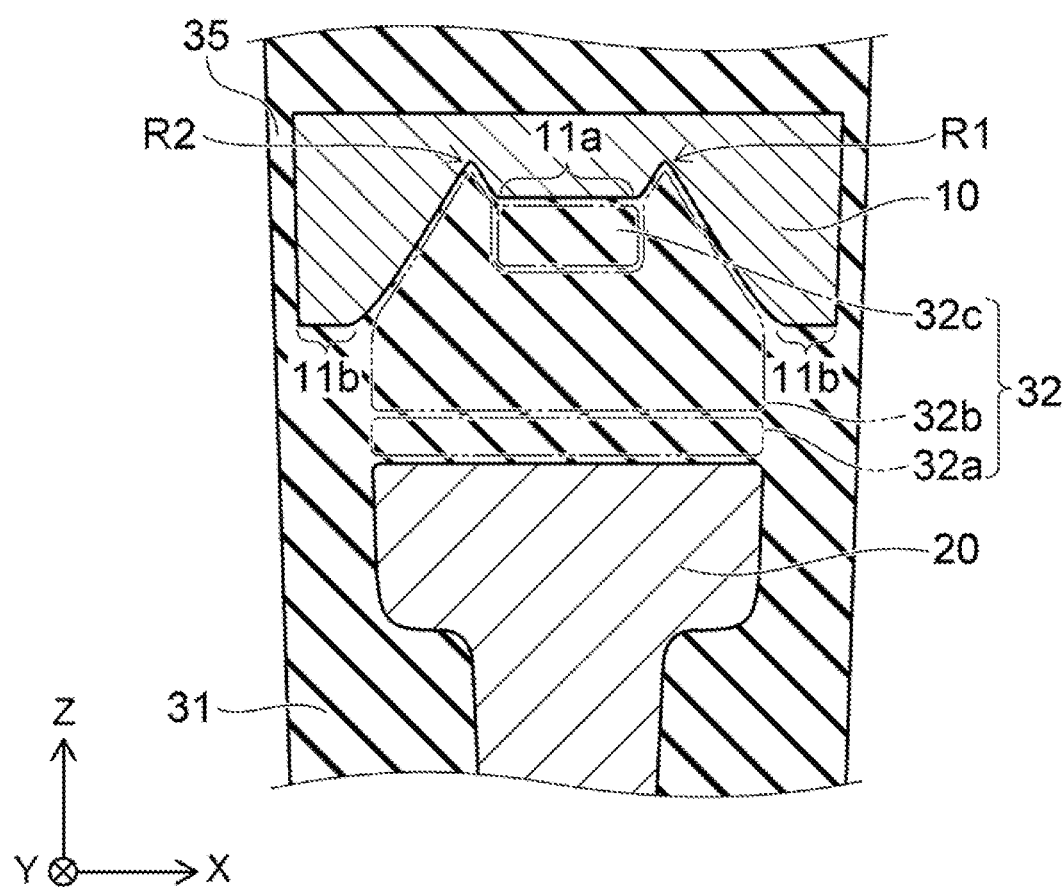

By the processes illustrated in FIGS. 4A to 6B, the configuration illustrated in FIG. 11B can be obtained, for example, in embodiments where a difference of the etching rates of the insulating layers IL1 and IL3 is larger than a difference of the etching rates between the insulating layer IL4 and the insulating layer IL3, and the insulating layers IL1, IL3, and IL4 are removed while leaving a part of the insulating layer IL4.

In such embodiments, as illustrated in FIG. 11B, the insulating part 32 between the gate electrode 10 and the FP electrode 20 includes a third insulating portion 32c in addition to the first insulating portion 32a and the second insulating portion 32b. The third insulating portion 32c is positioned between the second insulating portion 32b and the gate electrode 10 in the Z direction. The third insulating portion 32c contains boron and phosphorous in higher concentrations than either of the first insulating portion 32a and the second insulating portion 32b.

Figure 12A:
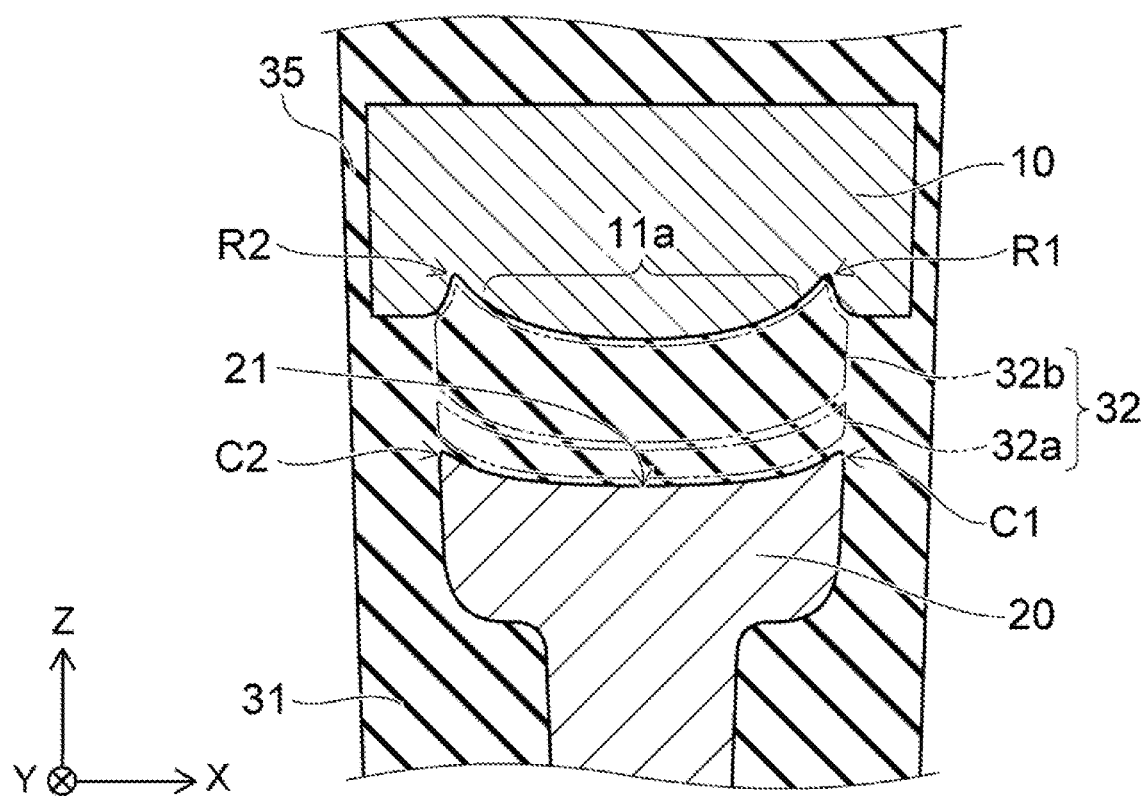
FIG. 12A and FIG. 12B are cross-sectional views illustrating embodiments of apart of the semiconductor device according to the modification of the first aspect.

In the embodiments illustrated in FIG. 12A, the region 11a is downwardly bent in a rounded convex shape, and the upper surface 21 of the FP electrode 20 is also downwardly bent in a rounded convex shape. In the depicted embodiments, the first insulating portion 32a and the second insulating portion 32b between the gate electrode 10 and the FP electrode 20 are also downwardly bent in a rounded convex shape.

Figure 12B:
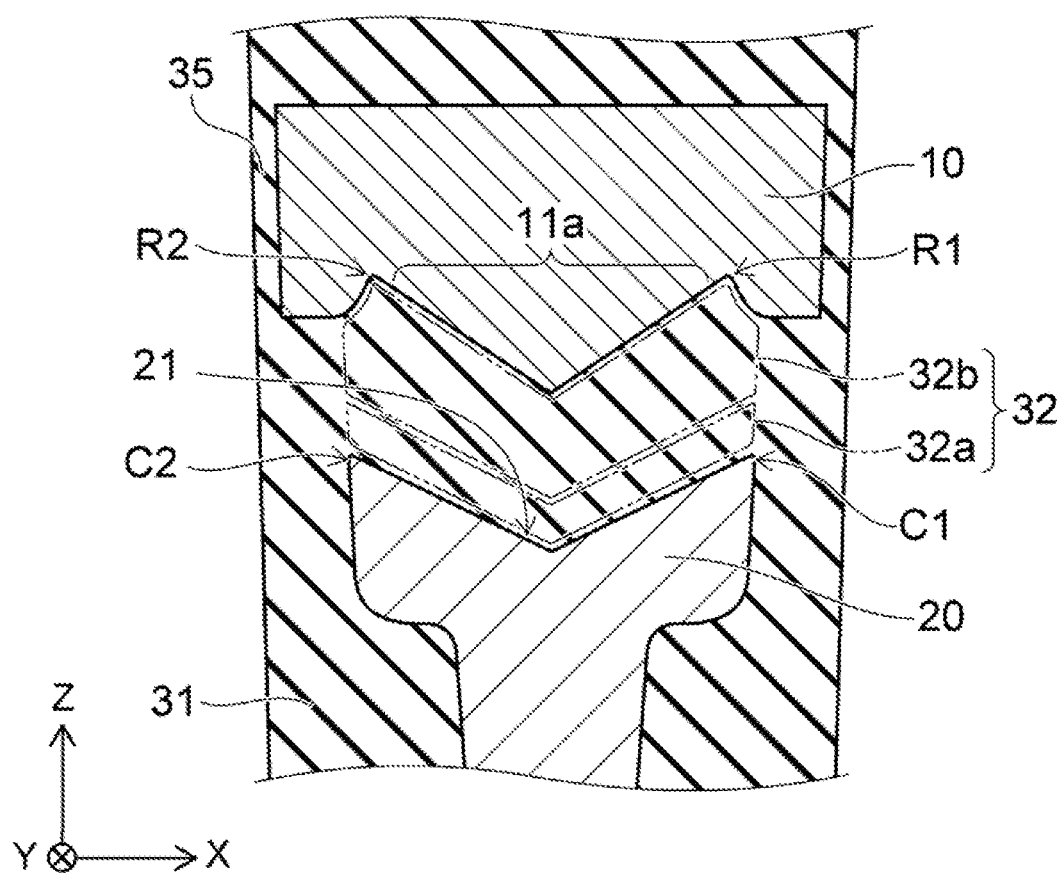

In the embodiments illustrated in FIG. 12B, the region 11a and the upper surface 21 are downwardly bent in a convex, substantially triangular shape. Then, the first insulating portion 32a and the second insulating portion 32b are also downwardly bent in a convex, substantially triangular shape.

In the case of the embodiments illustrated in FIGS. 12A and 12B, the concentration of electric field in the corners C1 and C2 of the FP electrode 20 is strengthened. Additionally, according to these embodiments, the recesses R1 and R2 are positioned above the corners C1 and C2 respectively, so that the concentration of electric field in these corners can be suitably alleviated.

The relative magnitude of the impurity concentrations between the respective semiconductor regions in the embodiments described above can be confirmed using a scanning capacitance microscope (SCM), for example. The carrier concentrations in the respective semiconductor regions may be the same or substantially the same as those of the impurity concentrations activated in the respective semiconductor regions. The relative magnitude of the carrier concentration between the respective semiconductor regions may be confirmed using the SCM.

The impurity concentrations in the respective semiconductor regions may be measured by a secondary ion mass spectrometry (SIMS), for example.

In the description of some embodiments, a component provided "on" another component can encompass cases where the former component is directly on (e.g., in physical contact with) the latter component, as well as cases where one or more intervening components are located between the former component and the latter component.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Moreover, some or all of the above described embodiments can be combined when implemented.

What is claimed is:

1. A method of manufacturing a semiconductor device, comprising:
    providing a semiconductor substrate including:
        a first semiconductor layer having an upper surface in which a trench is formed;
        a first insulating layer that is provided along an inner wall of the trench and on the upper surface of the first semiconductor layer;
        a first electrode that is provided in a lower portion in the trench on the first insulating layer; and
        a second insulating layer that is provided on an upper surface of the first electrode;
    forming a third insulating layer along the inner wall of the trench, on the upper surface of the first semiconductor layer and along a surface of the second insulating layer, with the first insulating layer interposed between the third insulating layer and the inner wall of the trench in a direction parallel to the upper surface of the first semiconductor layer and between the third insulating layer and the upper surface of the first semiconductor layer, the third insulating layer having an etching rate lower than an etching rate of the first insulating layer for an etching process;
    forming a fourth insulating layer on the third insulating layer and heating the fourth insulating layer to flatten an upper surface of the fourth insulating layer, the fourth insulating layer having an etching rate higher than the etching rate of the third insulating layer for the etching process;
    performing the etching process for a same given period of etching time on the first insulating layer, the third insulating layer, and the fourth insulating layer, thereby removing at least a portion of the first insulating layer, a portion of the third insulating layer, and a portion of the fourth insulating layer, wherein the first insulating layer, the third insulating layer and the fourth insulating layer are isotropically etched in the etching process;
    forming a first projection and a second projection in an upper surface of the third insulating layer, positioned on the second insulating layer and protruding upward; and
    forming a gate electrode directly on the first projection and the second projection of the third insulating layer.

2. The method of claim 1, wherein removing at least the portion of the first insulating layer, the portion of the third insulating layer, and the portion of the fourth insulating layer is performed using the etching process, such that the fourth insulating layer is etched more than the third insulating layer.

3. The method of claim 2, wherein the etching process is performed at least until the fourth insulating layer is removed.

4. The method of claim 1, wherein the third insulating layer is formed to include boron in a greater concentration than a boron concentration of at least one of the first insulating layer or the second insulating layer.

5. The method of claim 4, wherein the fourth insulating layer is formed to include boron in greater concentration than the boron concentration of the third insulating layer.

6. The method of claim 1, wherein the third insulating layer is formed such that the trench is not completely filled.

7. The method of claim 6, wherein the third insulating layer is formed such that the third insulating layer defines a recess, and the fourth insulating layer is disposed on the third insulating layer and in the recess.

8. The method of claim 1, wherein the second insulating layer is thinner than the first insulating layer.

9. The method of claim 1, wherein the portion of the fourth insulating layer that is removed in the given period of etching time is larger than the portion of the third insulating layer that is removed in the given period of etching time, and the portion of the third insulating layer that is removed in the given period of etching time is smaller than the portion of the first insulating layer that is removed in the given period of etching time.

10. The method of claim 1, wherein the etching process is performed simultaneously for the same given period of etching time on the first insulating layer, the third insulating layer, and the fourth insulating layer.

11. A semiconductor device, comprising:
    a first semiconductor region of a first conductivity type;
    a second semiconductor region of a second conductivity type that is provided on the first semiconductor region;
    a third semiconductor region of the first conductivity type that is provided on the second semiconductor region;
    a first insulating part that is provided in the first semiconductor region;
    a first electrode that is provided in the first semiconductor region, the first insulating part disposed between the first electrode and the first semiconductor region;
    a second insulating part that is provided on the first electrode;
    a gate electrode that is provided on the second insulating part;
    a gate insulating part that is provided between the gate electrode and the second semiconductor region; and a second electrode that is provided on the second semiconductor region and on the third semiconductor region, and is electrically connected to the second semiconductor region, the third semiconductor region, and the first electrode;

wherein:
- the gate electrode has:
  - a lower surface indented upward, defining a first recess and a second recess, and
  - a first side surface that faces the second semiconductor region in a first direction via the gate insulating part,
- the first recess is positioned between the second recess and the first side surface in the first direction,
- a distance in the first direction between the first recess and the second recess is longer than a distance in the first direction between the first side surface and the first recess, and
- the second insulating part includes:
  - a first insulating portion,
  - a second insulating portion that is provided between the gate electrode and the first insulating portion, contains boron in a higher concentration than a boron concentration of the first insulating portion, and includes a first projection and a second projection that protrude upward, the first projection provided in the first recess and the second projection provided in the second recess.

12. The semiconductor device according to claim 11, wherein the first electrode has an upper surface, a second side surface, and a third side surface on a side opposite to the second side surface,
a first corner between the upper surface and the second side surface is in line with the first recess in a second direction, and
a second corner between the upper surface and the third side surface is in line with the second recess in the second direction.

13. The semiconductor device according to claim 12, wherein the second insulating portion has a dielectric constant higher than a dielectric constant of the first insulating portion.

14. The semiconductor device according to claim 11, wherein the second insulating portion has a dielectric constant higher than a dielectric constant of the first insulating portion.

15. A semiconductor device, comprising:
a first semiconductor region of a first conductivity type;
a second semiconductor region of a second conductivity type that is provided on the first semiconductor region;
a third semiconductor region of the first conductivity type that is provided on the second semiconductor region;
a first insulating part that is provided in the first semiconducting region;
a first electrode that is provided in the first semiconductor region having a side surface, the first insulating part disposed between the first electrode and the first semiconducting region;
a second insulating part that is provided on the first electrode;
a gate electrode that has a lower surface which defines a recess indented upward, provided on the second insulating part;
a gate insulating part that is provided between the gate electrode and the second semiconductor region; and
a second electrode that is provided on the second semiconductor region and on the third semiconductor region, and electrically connected to the second semiconductor region, the third semiconductor region, and the first electrode;

wherein:
- the gate electrode faces the second semiconductor region in a first direction via the gate insulating part,
- the recess is in line with a corner between an upper surface of the first electrode and the side surface of the first electrode in a vertical direction, and
- the second insulating part includes:
  - a first insulating portion, and
  - a second insulating portion that is provided between the gate electrode and the first insulating portion, has a dielectric constant higher than a dielectric constant of the first insulating portion, wherein the second insulating portion includes a projection that protrudes upward, the projection provided in the recess.

16. The semiconductor device according to claim 15, wherein the second insulating portion contains boron in a higher concentration than a boron concentration of the first insulating portion.

* * * * *